US005623343A

United States Patent [19]
Nara et al.

[11] Patent Number: 5,623,343
[45] Date of Patent: Apr. 22, 1997

[54] EXPOSURE METHOD AND APPARATUS

[75] Inventors: Kei Nara; Masamitsu Yanagihara; Seiji Miyazaki, all of Yokohama, Japan

[73] Assignee: Nikon Corporation, Japan

[21] Appl. No.: 548,402

[22] Filed: Oct. 26, 1995

[30] Foreign Application Priority Data

Oct. 28, 1994 [JP] Japan .................. 6-289153

[51] Int. Cl.$^6$ ............................................. G01B 11/00
[52] U.S. Cl. .............................. 356/399; 356/401
[58] Field of Search ........................ 356/399–401; 250/548, 559.3; 355/43, 53

[56] References Cited

U.S. PATENT DOCUMENTS

| | | | |
|---|---|---|---|
| 4,566,795 | 1/1986 | Matsuura | 356/400 |
| 4,780,617 | 10/1988 | Umatate et al. | 250/548 |
| 4,937,618 | 6/1990 | Ayata | 355/43 |
| 5,140,366 | 8/1992 | Shiozawa | 355/53 |
| 5,148,214 | 9/1992 | Ohta | 355/43 |
| 5,150,173 | 9/1992 | Isobe | 356/401 |
| 5,160,959 | 11/1992 | Ina | 355/43 |
| 5,262,822 | 11/1993 | Kosugi | 355/53 |
| 5,365,342 | 11/1994 | Ayata | 356/401 |
| 5,477,304 | 12/1995 | Nishi | 355/53 |
| 5,499,099 | 3/1996 | Sato | 356/400 |
| 5,502,313 | 3/1996 | Nakamura | 250/559.26 |

OTHER PUBLICATIONS

Pending U.S. Patent Application Ser. No. 08/422,954 of Miyazaki et al., filed Apr. 17, 1995.

*Primary Examiner*—Frank Gonzalez
*Assistant Examiner*—Michael Stafira
*Attorney, Agent, or Firm*—Pennie & Edmonds

[57] ABSTRACT

In the first step of an exposure method of the present invention, an alignment optical system is arranged to oppose one of a first mask mark on a photomask and a first substrate mark on a photosensitive substrate, thereby detecting a first deviation amount between the position of the first mask mark and that of the first substrate mark. In the second step, the alignment optical system is arranged to oppose one of a second mask mark on the photomask and a second substrate mark on the photosensitive substrate, thereby detecting a second deviation mark between the position of the second mask mark and that of the second substrate mark. In the third step, correction values for minimizing the first and second deviation amounts are calculated. In the fourth step, the relative positional relationship between the image of an original pattern on the photomask and a shot area on the photosensitive substrate is adjusted on the basis of a correction value. In the fifth step, at least one of the first and second steps is executed subsequent to the fourth step to newly detect the first or second deviation amount. In the sixth step, the first to fifth steps are repeatedly executed until one of the first and second deviation amounts detected in the fifth step falls within a predetermined allowance.

23 Claims, 13 Drawing Sheets

EXPOSURE METHOD AND APPARATUS

BACKGROUND OF THE INVENTION

1. Field of the Invention

The present invention relates to an exposure method and apparatus which are used to manufacture semiconductor devices, liquid crystal display devices, or the like by photolithography and can be suitably applied to the scanning or stepping exposure method.

2. Related Background Art

In a conventional exposure method using photolithography to manufacture semiconductor devices, liquid crystal display devices, or the like, a photomask having an original pattern formed thereon and a photosensitive substrate coated with a photosensitive agent are positioned in accordance with the following procedures.

The relative positional relationship between positioning mask marks formed on the photomask and positioning substrate marks formed on the photosensitive substrate is measured in accordance with a plurality of combinations of the mask marks and the substrate marks. Subsequently, on the basis of the measurement result of the mask marks and the substrate marks, a correction value for appropriately correcting the positional relationship between the photomask and the photosensitive substrate, or the positional relationship between a pattern area where the original pattern on the photomask is located and a shot area where the image of the original pattern is projected on the photosensitive substrate is calculated using a method of least squares.

On the basis of the calculated correction value, the photomask and the photosensitive substrate are relatively moved. Alternatively, the imaging characteristics of an imaging optical system for projecting the image of the original pattern of the photomask on the photosensitive substrate are adjusted, thereby correcting the positional relationship between the photomask and the photosensitive substrate or the positional relationship between the pattern area of the photomask and the shot area of the photosensitive substrate. Subsequently, the image of the original pattern of the photomask is actually exposed on the photosensitive substrate.

A prior art associated with such an exposure method is described in detail in, e.g., "U.S. Pat. No. 4,566,795 (Japanese Patent Laid-Open No. 57-138134)".

SUMMARY OF THE INVENTION

It is an object of the present invention to provide an exposure method and apparatus which decrease displacement of an original pattern on a photomask with respect to the shot area of a photosensitive substrate and perform exposure processing on the basis of alignment more accurate than that of the prior art.

In order to achieve the above object, according to the present invention, there is provided an exposure method comprising (a) the first step of arranging an alignment optical system to oppose one of a first mask mark formed on a photomask and a first substrate mark formed on a surface of a photosensitive substrate in correspondence with the first mask mark to measure a relative positional relationship between the first mask mark and the first substrate mark, thereby detecting a first deviation amount between a position of the first mask mark and that of the first substrate mark, (b) the second step of arranging the alignment optical system to oppose one of a second mask mark formed on the photomask at a position different from that of the first mask mark and a second substrate mark formed on the surface of the photosensitive substrate in correspondence with the second mask mark to measure a relative positional relationship between the second mask mark and the second substrate mark, thereby detecting a second deviation amount between a position of the second mask mark and that of the second substrate mark, (c) the third step of calculating a correction value for minimizing the first and second deviation amounts detected in the first and second steps, respectively, (d) the fourth step of adjusting a relative positional relationship between an image of an original pattern formed on the photomask and a shot area defined on the photosensitive substrate on the basis of the correction value calculated in the third step, (e) the fifth step of executing at least one of the first and second steps subsequent to the fourth step to newly detect the first or second deviation amount, and (f) the sixth step of repeatedly executing the first to fifth steps until one of the first and second deviation amounts detected in the fifth step falls within a predetermined allowance, and exposing the image of the original pattern onto the shot area when the first or second deviation amount detected in the fifth step falls within the predetermined allowance.

In order to achieve the above object, according to the present invention, there is also provided an exposure apparatus comprising (a) an illumination optical system for irradiating an exposure light beam on a photomask to expose an image of an original pattern formed on the photomask onto a surface of a photosensitive substrate arranged to oppose the photomask, (b) an alignment optical system which is arranged to oppose one of a first mask mark formed on the photomask and a first substrate mark formed on the surface of the photosensitive substrate in correspondence with the first mask mark, thereby measuring a relative positional relationship between the first mask mark and the first substrate mark, and arranged to oppose one of a second mask mark formed on the photomask at a position different from that of the first mask mark and a second substrate mark formed on the surface of the photosensitive substrate in correspondence with the second mask mark, thereby measuring a relative positional relationship between the second mask mark and the second substrate mark, (c) an alignment adjustment mechanism for adjusting a relative positional relationship between the image of the original pattern formed on the photomask and a shot area formed on the surface of the photosensitive substrate, and (d) a central control unit including a deviation detection unit for detecting, on the basis of a measurement result from the alignment optical system, a first deviation amount between a position of the first mask mark and that of the first substrate mark and a second deviation amount between a position of the second mask mark and that of the second substrate mark, a correction value calculation unit for calculating, on the basis of a detection result of the deviation detection unit, correction values for minimizing the first and second deviation amounts and comparing the first and second deviation amounts with a predetermined allowance, and a control unit for controlling operations of the illumination optical system, the alignment optical system, and the alignment adjustment mechanism on the basis of a calculation result from the correction value calculation unit.

The control unit causes the alignment optical system to measure the relative positional relationship between the first mask mark and the first substrate mark and the relative positional relationship between the second mask mark and the second substrate mark to cause the deviation detection unit to detect the first or second deviation amount, causes the correction value calculation unit to calculate the correction values, causes the alignment adjustment mechanism to adjust the relative positional relationship between the image of the original pattern and the shot area on the basis of the correction values, thereafter repeatedly causes the alignment optical system to measure at least one of the relative positional relationship between the first mask mark and the first substrate mark and the relative positional relationship between the second mask mark and the second substrate mark to cause the deviation detection unit to newly detect the first or second deviation amount and cause the correction value calculation unit to compare the first or second deviation amount with the predetermined allowance until one of the first and second deviation amounts newly detected by the deviation detection unit falls within the predetermined allowance, and causes the illumination optical system to expose the image of the original pattern onto the shot area when the first or second deviation amount newly detected by the deviation detection unit falls within the predetermined allowance.

In the exposure method and apparatus with the above arrangement, the relative positional relationship between the photomask and the photosensitive substrate is measured, thereby detecting the deviation amount between the position of the photomask and that of the photosensitive substrate. Subsequently, the correction value for minimizing the deviation amount is calculated, and the relative positional relationship between the images of the original pattern formed on the photomask and the shot area defined on the photosensitive substrate is adjusted on the basis of the correction value. Thereafter, the relative positional relationship between the photomask and the photosensitive substrate corrected in this manner is measured, thereby detecting the deviation amount between the position of the photomask and that of the photosensitive substrate again.

The above processing is repeatedly executed until the new deviation amount falls within the predetermined allowance. When the new deviation amount falls within the predetermined allowance, the image of the original pattern is exposed onto the shot area. The relative positional relationship between the photomask and the photosensitive substrate is always precisely determined. Therefore, displacement of the original pattern formed on the photomask with respect to the shot area defined on the surface of the photosensitive substrate is minimized.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

Figure 1:
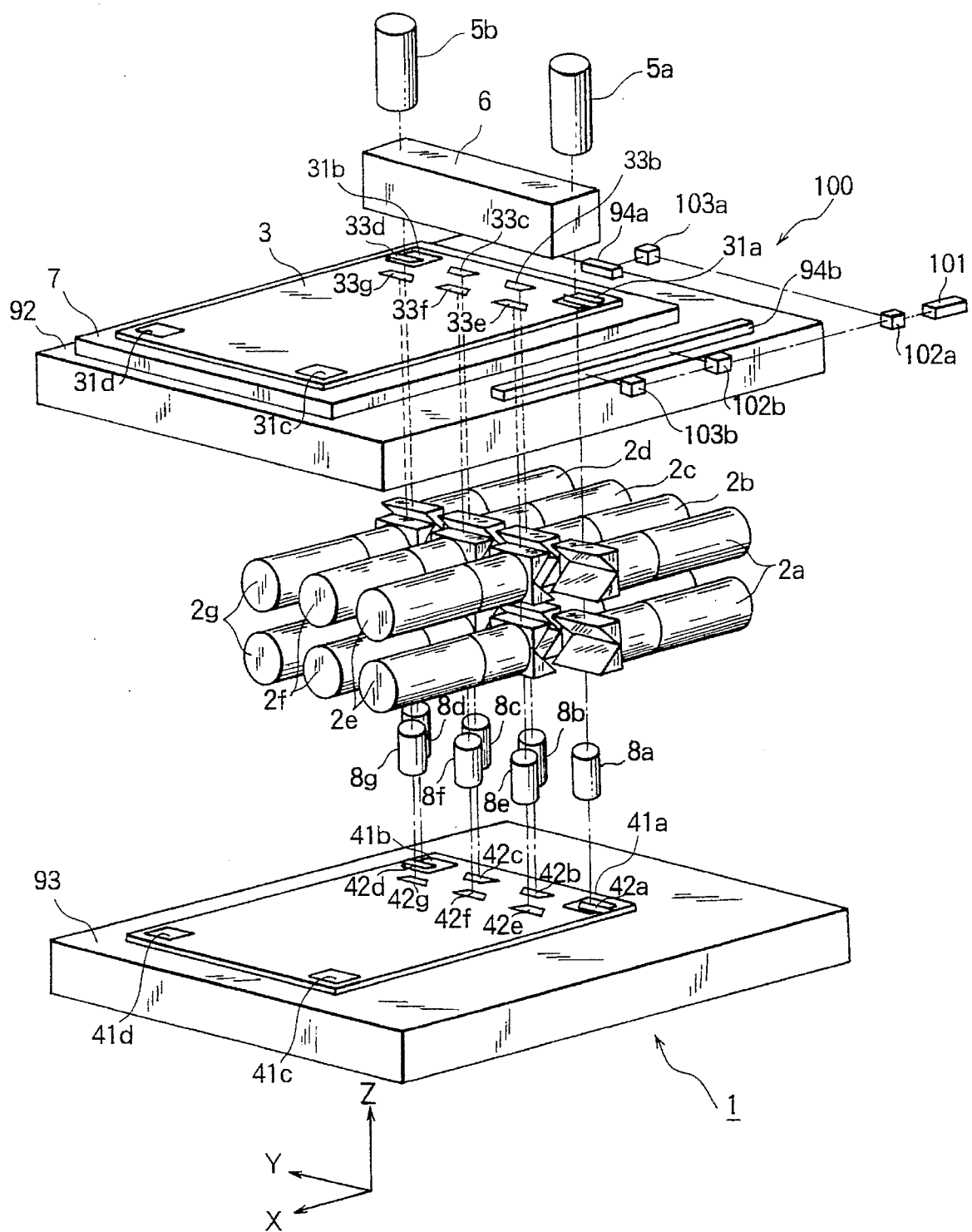
FIG. 1 is a perspective view schematically showing an arrangement of an exposure apparatus according to an embodiment of the present invention.

The arrangement and function of an exposure method and apparatus according to an embodiment of the present invention will be described below in detail with reference to FIGS. 1 to 13C. The same reference numerals denote the same elements throughout the drawings, and a detailed description thereof will be omitted. The dimensional ratios in the drawings do not necessarily coincide with those in the description.

Figure 2:
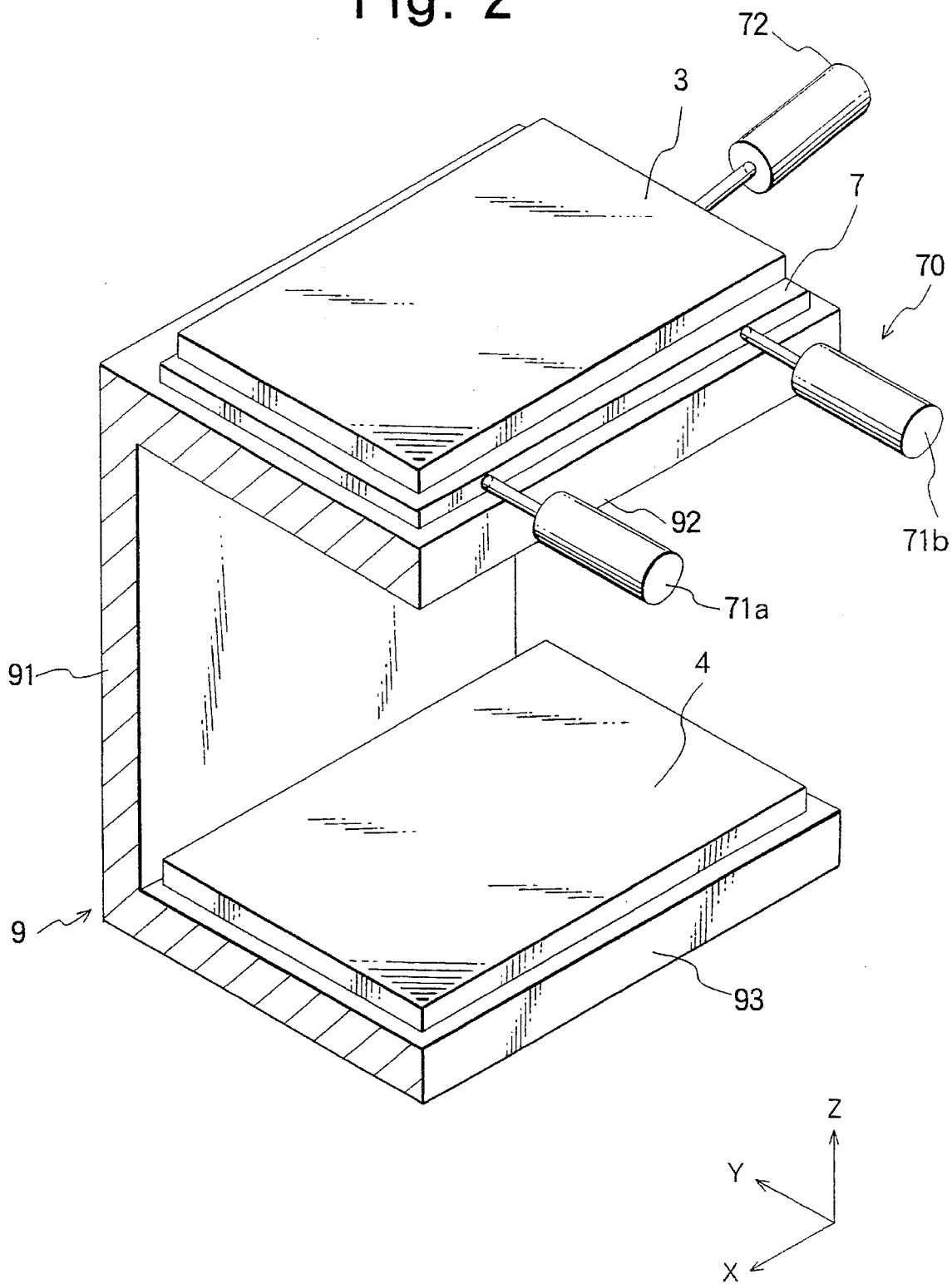
FIG. 2 is a perspective view showing an arrangement of a stage mechanism which is omitted in the exposure apparatus shown in FIG. 1.
Figure 3:
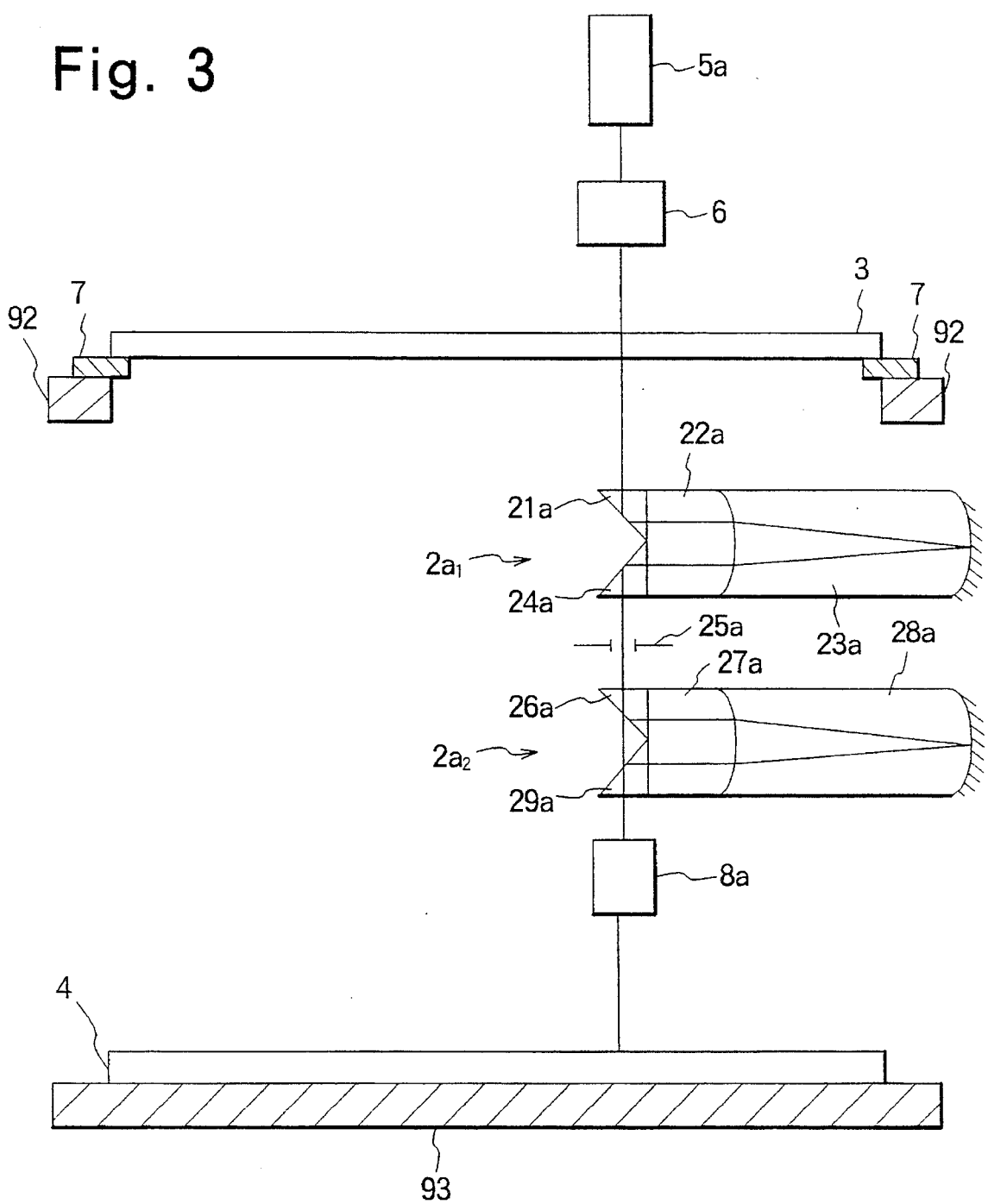
FIG. 3 is a sectional view showing a structure taken along the X-Z plane positioned at an almost center of the exposure apparatus shown in FIG. 1.
Figure 3:
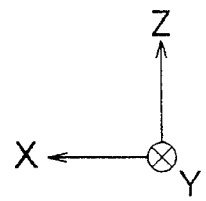

As shown in FIGS. 1 to 3, in an exposure apparatus 1 of this embodiment, a photomask 3 and a photosensitive substrate 4, which are arranged to oppose each other while sandwiching seven projection optical systems 2a to 2g therebetween, are adjusted to have a predetermined positional relationship. Thereafter, the photomask 3 and the photosensitive substrate 4 are relatively moved with respect to the seven projection optical systems 2a to 2g, an illumination optical system 6, and the like, thereby exposing an entire original pattern formed on the photomask 3 onto the upper surface of the photosensitive substrate 4.

Figure 9:
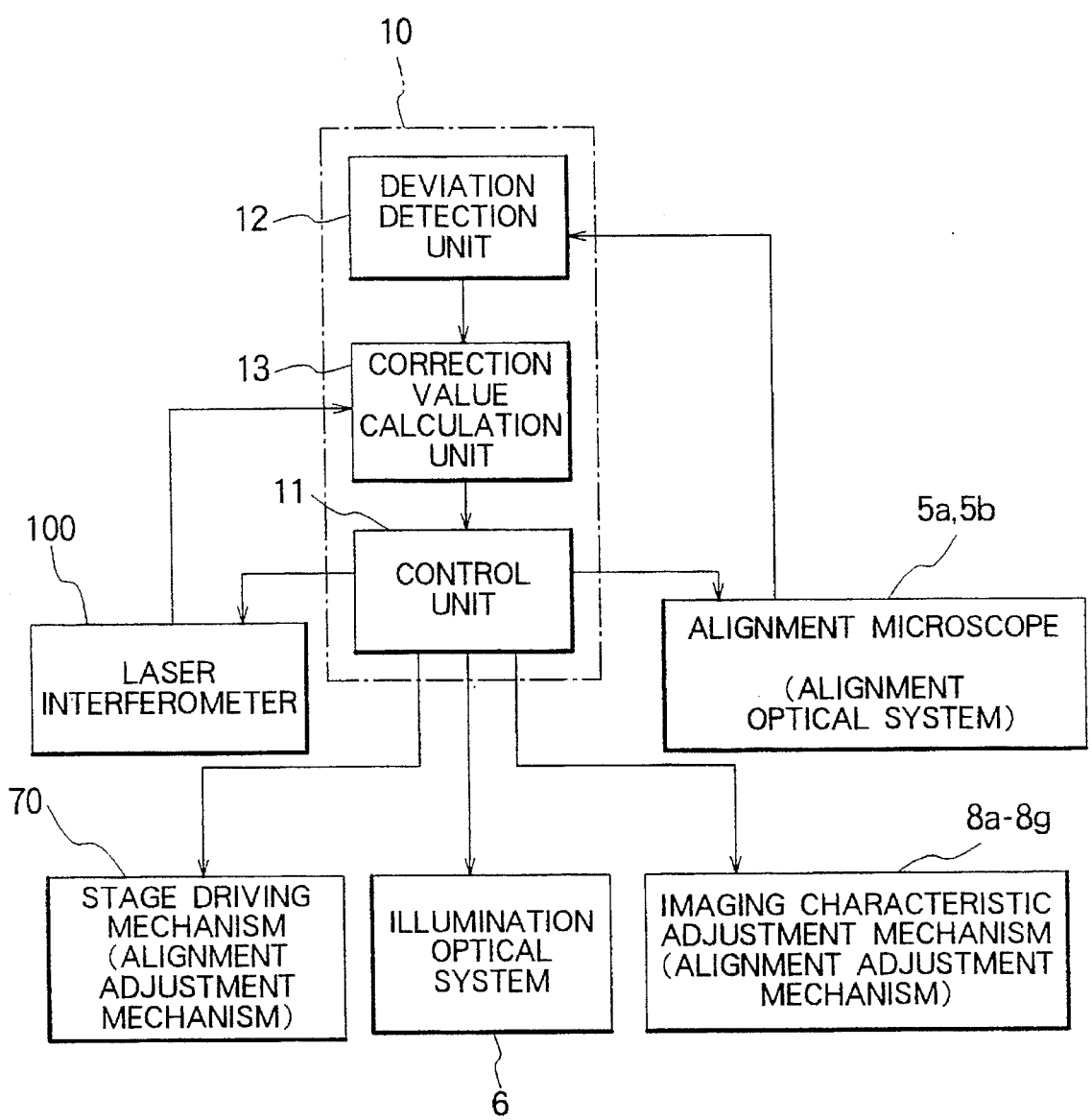
FIG. 9 is a block diagram showing an arrangement of a control mechanism which is omitted in the exposure apparatus shown in FIG. 1.

As shown in FIG. 9, in the exposure apparatus 1, two alignment microscopes 5a and 5b are arranged as an alignment optical system for adjusting the relative positional relationship between the photomask 3 and the photosensitive substrate 4. A central processing unit 10 including a deviation detection unit 12, a correction value calculation unit 13, and a control unit 11 is arranged as a control arithmetic system. A stage driving mechanism 70 and seven imaging characteristic adjustment mechanisms 8a to 8g are arranged as an alignment adjustment mechanism.

This exposure apparatus 1 includes a carriage 9 for integrally holding the photomask 3 and the photosensitive substrate 4 while forming a gap therebetween, and the seven projection optical systems 2a to 2g for forming the image of the original pattern formed on the photomask 3 onto a photosensitive agent coated on the upper surface of the photosensitive substrate 4, and functions as a scanning exposure apparatus. The coordinate system set in this exposure apparatus 1 is constituted by a Z-axis extending parallel to the optical axes of the seven projection optical systems 2a to 2g, an X-axis extending parallel to the moving direction of the photomask 3 and the photosensitive substrate 4, and a Y-axis extending parallel to a direction perpendicular to the Z- and X-axes.

As shown in FIG. 2, the carriage 9 has an almost C-shaped section along the Y-Z plane and has a shape of a flat plate bent at two portions. More specifically, in the carriage 9, a plate-like columnar portion 91 vertically stands along the X-Z plane, a plate-like mask stage 7 is movably set on the upper surface of a plate-like upper arm portion 92 extending along the X-Y plane from the upper end of the columnar portion 91, and the photosensitive substrate 4 is chucked and held on the upper surface of a plate-like lower arm portion 93 extending along the X-Y plane from the lower end of the columnar portion 91.

As shown in FIG. 3, a rectangular opening portion is formed in the upper arm portion 92 of the carriage 9. The mask stage 7 is set to be movable along the X-Y plane while partially covering the opening portion of the upper arm portion 92 of the carriage 9. A rectangular opening portion is formed in the mask stage 7. The photomask 3 is chucked and held by the mask stage 7 while covering the opening portion of the mask stage 7.

As shown in FIG. 2, the stage driving mechanism 70 is arranged around the mask stage 7. For the stage driving mechanism 70, the driving shafts of two driving motors 71a and 71b, which extend along the Y-axis, are attached to one side portion of the mask stage 7, which extends along the X-axis. The driving shaft of a driving motor 72, which extends along the X-axis, is attached to the other side portion of the mask stage 7, which extends along the Y-axis. The three driving motors 71a, 71b, and 72 move the mask stage 7 holding the photomask 3 parallel to the X- and Y-axes and rotate the mask stage 7 about the Z-axis.

More specifically, the two driving motors 71a and 71b move the mask stage 7 parallel to the Y-axis or rotate the mask stage 7 about the Z-axis on the basis of a control signal input from the central control unit 10 (to be described later) included in the main body. The driving motor 72 moves the mask stage 7 parallel to the X-axis on the basis of a control signal input from the central control unit 10. Additionally, the carriage 9 is arranged to integrally move the photomask 3 and the photosensitive substrate 4 along the X-axis on the basis of a carriage driving mechanism (not shown) included in the main body.

As shown in FIG. 1, two reflecting members 94a and 94b are arranged on the upper surface of the upper arm portion 91 of the carriage 91 to be close to the mask stage 7. The reflecting member 94a has a prismatic shape with a reflecting surface extending along the Y-axis. The reflecting member 94b has a prismatic shape with a reflecting surface extending along the X-axis.

A laser interferometer 100 is arranged in the periphery of the upper arm portion 92 of the carriage 9. In the laser interferometer 100, e.g., a laser source 101 for emitting an He-Ne laser beam (wavelength: 633 nm) is arranged. The laser source 101 emits a laser beam on the basis of a control signal input from the central control unit 10 (to be described later). The laser beam emitted from the laser source 101 is branched by a beam splitter 102a into two beams along the X- and Y-axes.

The laser beam emerging from the beam splitter 102a along the Y-axis is deflected by 90° by a prism 103a to propagate along the X-axis, and reflected by the reflecting member 94a of the carriage 9. The laser beam emerging from the beam splitter 102a along the X-axis is further branched by a beam splitter 102b into two beams along the X- and Y-axes.

The laser beam emerging from the beam splitter 102b along the Y-axis is reflected by the reflecting member 94b of the carriage 9. The laser beam emerging from the beam splitter 102b along the X-axis is deflected by 90° by a prism 103b to propagate along the Y-axis, and reflected by the reflecting member 94b of the carriage 9.

The arrangement of a coherent light detection unit for detecting coherent light of the laser beams reflected by the two reflecting members 94a and 94b and a reference laser beam is not illustrated. The coherent light detection unit outputs a measurement signal obtained upon measurement of the position of the mask stage 7 along the X- and Y-axes and rotation of the mask stage 7 about the Z-axis to the central control unit 10.

As shown in FIG. 3, opening portions are formed in the upper arm portion 92 of the carriage 9 and the mask stage 7. For this reason, an exposure light beam emitted from the illumination optical system 6 is transmitted through the photomask 3 and passes through the opening portions of the upper arm portion 92 of the carriage 9 and the mask stage 7.

Figure 4:
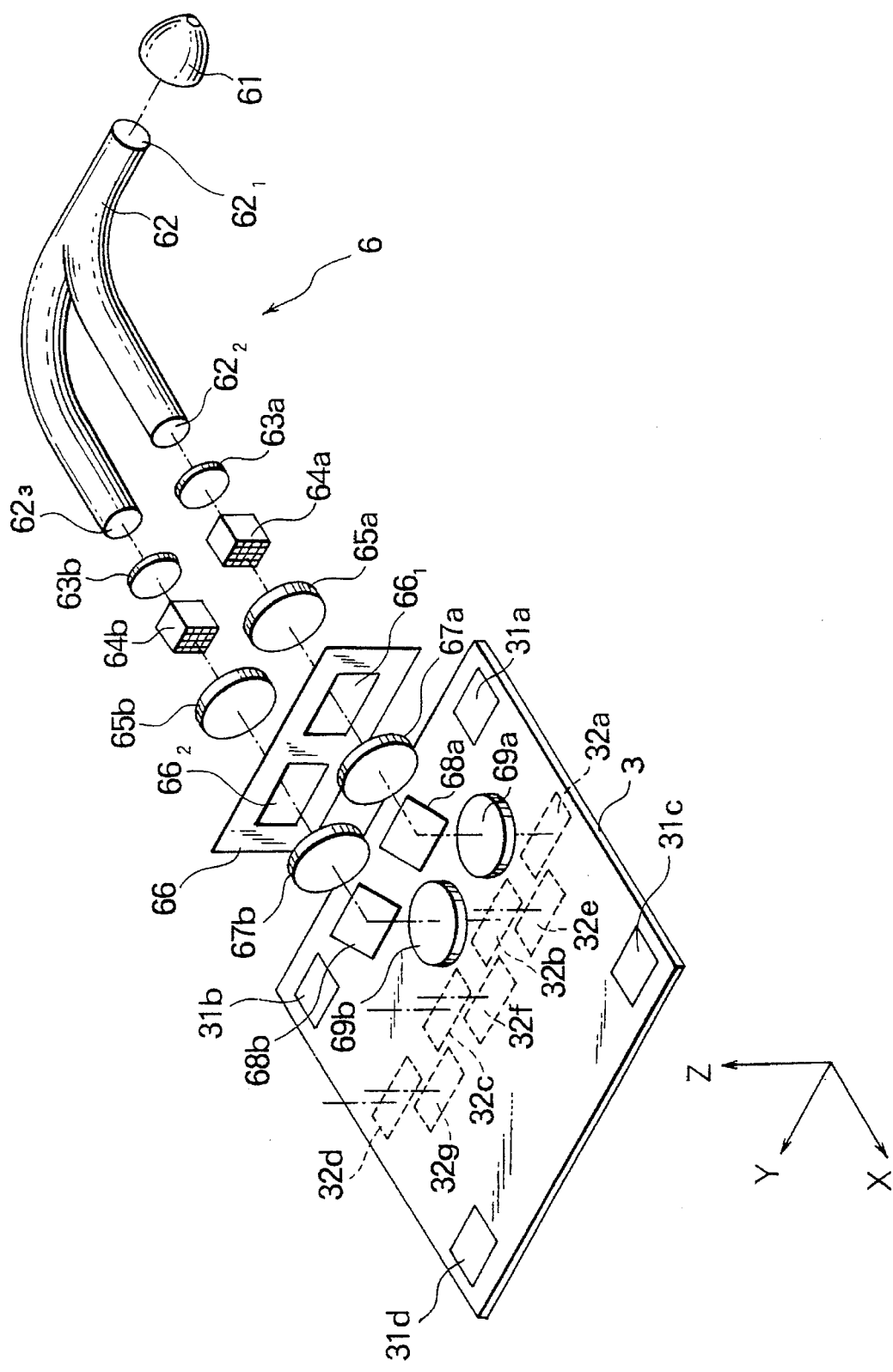
FIG. 4 is a perspective view showing a detailed arrangement of an illumination optical system applied to the exposure apparatus in FIG. 1.

As shown in FIGS. 1 and 3, the illumination optical system 6 is fixed above the upper arm portion 92 of the carriage 9. As shown in FIG. 4, in the illumination optical system 6, a light source (not shown) is arranged in an elliptical mirror 61 to emit an exposure light beam on the basis of a control signal input from the central control unit 10 (to be described later). Note that a mercury lamp for emitting a g-line (wavelength: 345 nm) or an i-line (wavelength: 365 nm) as an exposure light beam is preferably applied as the light source.

An exposure light beam emitted from this light source is condensed by the elliptical mirror 61 and incident on an incident end $62_1$ of a light guide 62 as a primary source image. The light guide 62 is constituted by a lot of optical fibers bundled at random. The exposure light beam incident on the light guide 62 emerges from two-branched exit ends $62_2$ and $62_3$ as secondary source images each having an almost uniform light intensity distribution. The exposure light beams emerging from the two-branched light guide 62 are respectively incident on the incident surfaces of fly-eye lenses 64a and 64b through two relay lenses 63a and 63b.

Each of the two fly-eye lenses 64a and 64b forms a lot of secondary sources at its exit end on the basis of the exposure light beam incident from the corresponding one of the relay lenses 63a and 63b. The front focal points of two condenser lenses 65a and 65b are arranged at positions where the lot of secondary sources are formed. The exposure light beams emerging from the lot of secondary sources uniformly illuminate a field stop 66 through the two condenser lenses 65a and 65b.

Two rectangular opening portions $66_1$ and $66_2$ are formed in the field stop 66. The exposure light beams passing through the two opening portions $66_1$ and $66_2$ are deflected by 90° at their optical paths by two mirrors 68a and 68b via two relay lenses 67a and 67b. The exposure light beams reflected by the two mirrors 68a and 68b respectively form two rectangular illumination areas 32a and 32b on the upper surface of the photomask 3 through two relay lenses 69a and 69b.

The two illumination areas 32a and 32b are aligned along the Y-axis. In addition, two illumination areas 32c and 32d are aligned on the same line of the two illumination areas 32a and 32b along the Y-axis. Furthermore, three illumination areas 32e to 32g are arranged on the positive side of the X-axis to be adjacent to the four illumination areas 32a to 32d, and aligned along the Y-axis in correspondence with gaps between the illumination areas 32a to 32d. Optical systems for forming the five illumination areas 32c to 32g have almost the same arrangement as that of the optical systems for forming the two illumination areas 32a and 32b. In FIG. 4, however, only optical axes are shown, and a detailed description thereof will be omitted.

Figure 5:
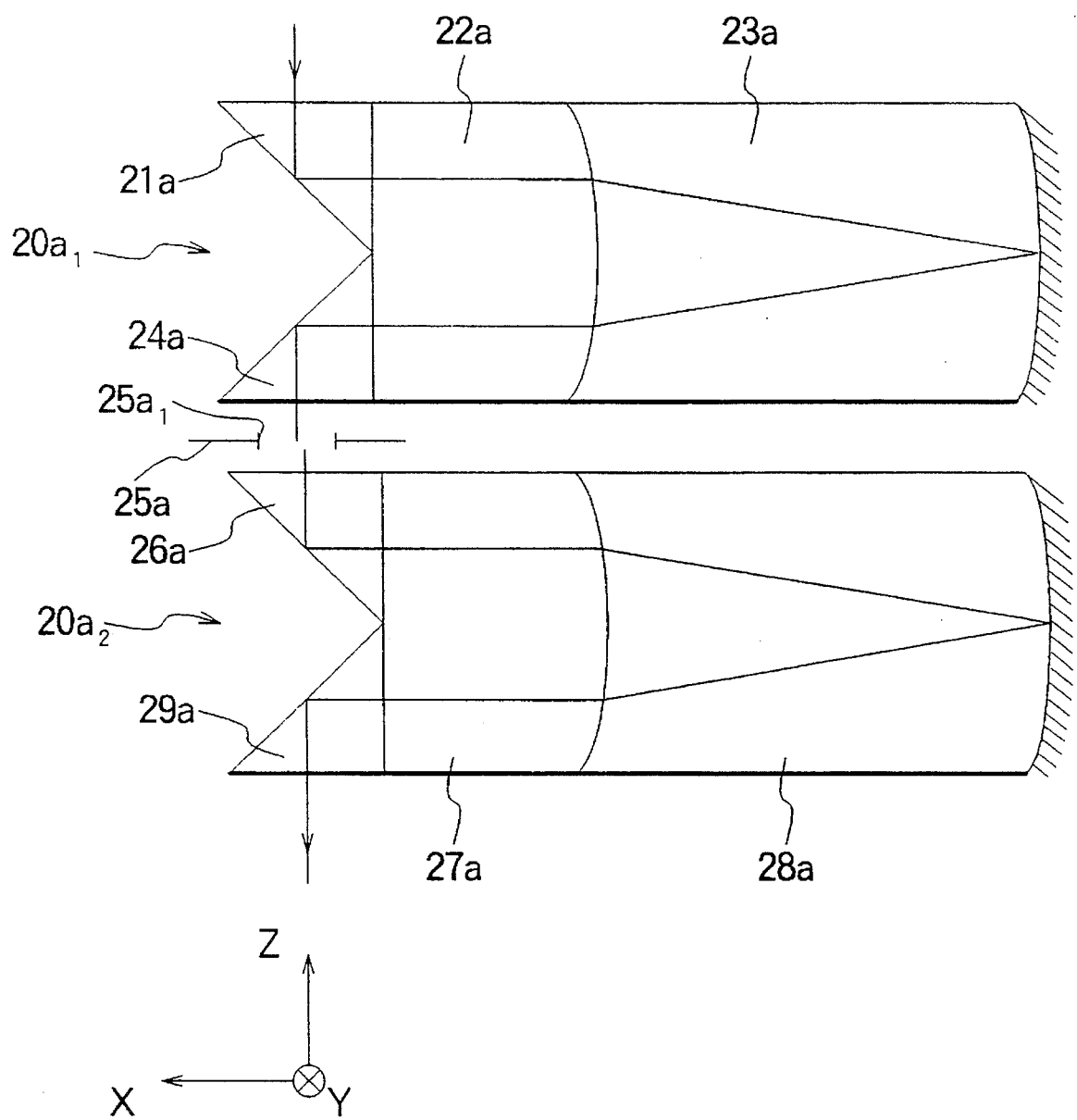
FIG. 5 is a sectional view showing a detailed arrangement of a projection optical system applied to the exposure apparatus in FIG. 1.

As shown in FIGS. 1 and 3, between the upper arm portion 92 and the lower arm portion 93 of the carriage 9, the seven projection optical systems 2a to 2g are fixed below the seven illumination areas 32a to 32g in correspondence with each other while their optical axes are set along the Z-axis. The seven imaging characteristic adjustment mechanisms 8a to 8g are fixed below the seven projection optical systems 2a to 2g in correspondence with each other while their optical axes are set along the Z-axis. As shown in FIG. 5, the projection optical system 2a is constituted by a first partial optical system $20a_1$ and a second partial optical system $20a_2$ as a modification of a Dyson optical system, and a field stop 25 arranged between the first partial optical system $20a_1$ and the second partial optical system $20a_2$.

In the first partial optical system $20a_1$, a rectangular prism 21a with a reflecting surface inclined by 45° with respect to a normal to the photomask 3 is arranged. An exposure light beam emerging from the illumination area 32a of the photomask 3 is deflected by 90° at its optical path by the rectangular prism 21a and incident on a plano-convex lens 22a. The plano-convex lens 22a has a flat surface joined with the rectangular prism 21a and a convex surface opposing this flat surface. A meniscus lens 23a is formed of a glass material different from that of the plano-convex lens 22a and has a concave surface joined to the convex surface of the plano-convex lens 22a and a convex surface on which a reflecting film is deposited to oppose the concave surface.

The exposure light beam incident on the plano-convex lens 22a is refracted by the junction interface between the plano-convex lens 22a and the meniscus lens 23a and reflected by the reflecting film of the meniscus lens 23a. The light beam is refracted by the junction interface between the plano-convex lens 22a and the meniscus lens 23a again and incident on a rectangular prism 24a. The rectangular prism 24a has a reflecting surface which is parallel to a normal to the rectangular prism 21a and inclined by 45° with respect to the normal to the photomask 3. The exposure light beam incident on the rectangular prism 24a is deflected by 90° at its optical path and formed into an image on the field stop 25a as a primary image of the illumination area 32a of the photomask 3.

Figure 6:
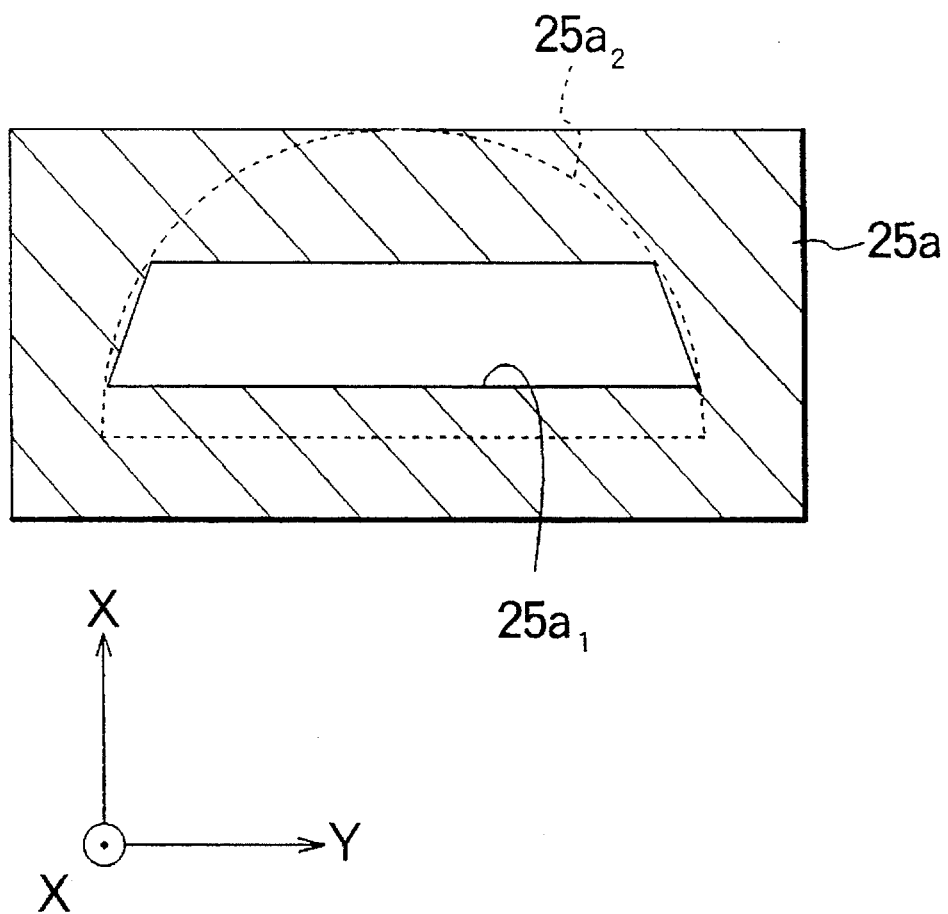
FIG. 6 is a plan view showing a structure of a field stop applied to the projection optical system in FIG. 5.

As shown in FIG. 6, a trapezoidal opening portion $25a_1$ is formed in a field stop 25a. As shown in FIGS. 3 and 5, in the second partial optical system $20a_1$, a rectangular prism 26a, a plano-convex lens 27a, a meniscus lens 28a, and a rectangular prism 29a are arranged as in the rectangular prism 21a, the plano-convex lens 22a, the meniscus lens 23a, and the rectangular prism 24a of the first partial optical system $20a_1$. The exposure light beam passing through the opening portion $25a_1$ of the field stop 25a is incident on the imaging characteristic adjustment mechanism 8a as a secondary image of the illumination area 32a of the photomask 3 through the second partial optical system $20a_2$.

The imaging characteristic adjustment mechanism 8a moves the image projected by the projection optical system 2a in parallel to the X- and Y-axes, rotates the projected image about the Z-axis, and increases or reduces the projection magnification.

More specifically, the imaging characteristic adjustment mechanism 8a rotates the secondary image of the illumination area 32a, which is incident from the projection optical system 2a, about the Z-axis, moves the image parallel to the X- and Y-axes with respect to the original pattern formed on the photomask 3, increases or reduces the magnification of the secondary image of the illumination area 32a, or corrects the orthogonality of two-dimensional directions included in the X-Y plane on the basis of a control signal input from the central control unit 10 (to be described later). The exposure light beam emerging from the imaging characteristic adjustment mechanism 8a is formed into an image on the upper surface of the photosensitive substrate 4 as a new secondary image of the illumination area 32a of the photomask 3.

The first and second partial optical systems $20a_1$ and $20a_2$ form an image having a transverse magnification which is positive along the X-axis and negative along the Y-axis. For this reason, the secondary image of the illumination area 32a of the photomask 3 is an erecting image having a transverse magnification positive along the X- and Y-axes. In this case, the projection optical system 2a and the imaging characteristic adjustment mechanism 8a are preferably telecentric on both the object side and the image side such that the exposure pattern on the photosensitive substrate 4 has no dimensional error even when a deviation is generated along the optical axis between the photomask 3 and the photosensitive substrate 4.

The plano-convex lens 22a and the meniscus lens 23a in the first partial optical system $20a_1$ have a circular section along the Y-Z plane. As indicated by a dashed line in FIG. 6, a maximum field area $25a_2$ of the first partial optical system $20a_1$ has a semicircular shape. Therefore, the X-direction width of the opening portion $25a_1$ of the field stop 25 is set to be maximum with respect to the maximum field area $25a_2$ by arranging the short side of a pair of parallel sides on the arc side of the maximum field area $25a_2$ and arranging the long side on the straight line side of the maximum field area $25a_2$.

Figure 7:
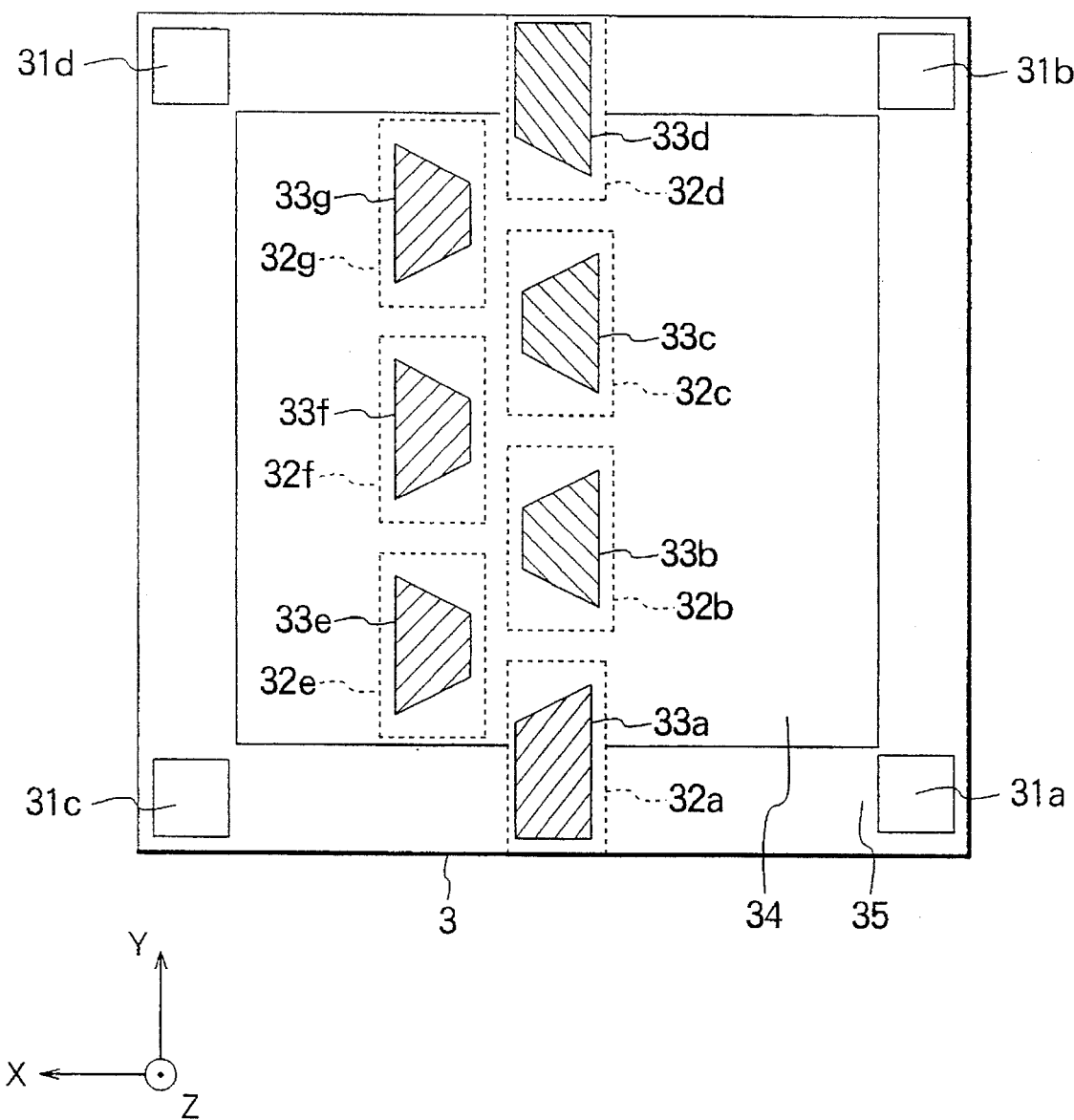
FIG. 7 is a plan view showing a positional relationship between a photomask in the exposure apparatus in FIG. 1 and a field area in the projection optical system in FIG. 5.
Figure 8:
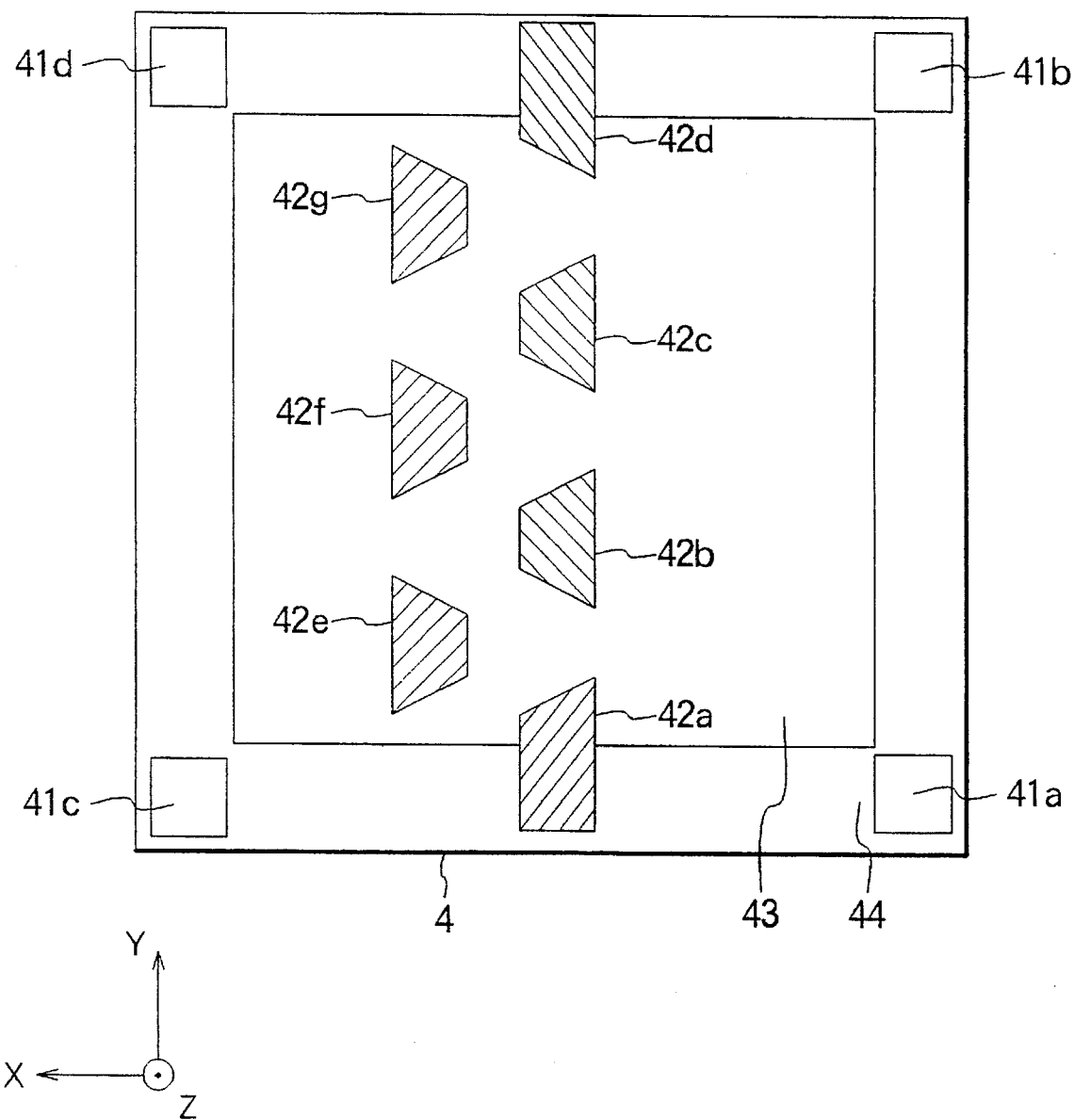
FIG. 8 is a plan view showing a positional relationship between the photomask in the exposure apparatus in FIG. 1 and an exposure area in the projection optical system in FIG. 5.

Therefore, as shown in FIGS. 1 and 7, in the illumination area 32a formed on the photomask 3, a trapezoidal field area 33a is defined by the opening portion $25a_1$ of the field stop 25a. As shown in FIGS. 1 and 8, a trapezoidal exposure area 42a is formed on the upper surface of the photosensitive substrate 4 as an erecting image, i.e., the secondary image of the field area 33a. Note that the six projection optical systems 2b to 2g have almost the same arrangement as that of the projection optical system 2a, and the six imaging characteristic adjustment mechanisms 8b to 8g have almost the same arrangement as that of the imaging characteristic adjustment mechanism 8a.

More specifically, six trapezoidal field areas 33b to 33g are defined in the six corresponding illumination areas 32b to 32g formed on the photomask 3, almost as in the field area 33a, respectively. Six trapezoidal exposure areas 42b to 42g are formed on the upper surface of the photosensitive substrate 4 as erecting images, i.e., the secondary images of the six field areas 33b to 33g, respectively.

As shown in FIG. 7, a rectangular pattern area 34 is defined inside the photomask 3 and formed as an original pattern of a variety of circuits. A light-shielding area 35 is formed around the pattern area 34 to shield an exposure light beam emitted from the illumination optical system 6. On the upper surface of the photomask 3, the short sides of pairs of parallel sides forming the four field areas 33a to 33d are arranged to oppose the short sides of pairs of parallel sides forming the three field areas 33e to 33g. In addition, the oblique sides forming the four field areas 33a to 33d are arranged to oppose the oblique sides forming the three field areas 33e to 33g. With this arrangement, the total width of the seven field areas 33a to 33g along the X-axis is set to become uniform along the Y-axis.

As shown in FIG. 8, a rectangular shot area 43 is defined inside the upper surface of the photosensitive substrate 4 as an exposure area throughout the original pattern formed on the pattern area 34 of the photomask 3. A non-photosensitive area 44 is formed around the shot area 43, which is not exposed with exposure light beams emitted from the seven projection optical systems 2a to 2g. The seven exposure areas 42a to 42g on the upper surface of the photosensitive substrate 4 are arranged to be similar to the seven field areas 33a to 33g. With this arrangement, the total width of the seven exposure areas 42a to 42g along the X-axis is set to become uniform along the Y-axis.

When the carriage 9 is moved along the X-axis, and the seven field areas 33a to 33g scan the entire pattern area 34 of the photomask 3, the seven exposure areas 42a to 42g transfer the image of the original pattern on the pattern area 34 onto the shot area 43 of the photosensitive substrate 4. At this time, a predetermined irradiation amount distribution of the exposure light can be obtained on the upper surface of the photomask 3. Therefore, a predetermined exposure light amount distribution can be obtained on the upper surface of the photosensitive substrate 4.

As shown in FIGS. 1, 4, and 7, four rectangular mask marks 31a to 31d are formed on the light-shielding area 35 of the photomask 3 as positioning marks for the photomask 3 and arranged to be close to the four vertices of the pattern area 34. The two mask marks 31a and 31b are aligned along the Y-axis on the negative side of the X-axis of the photomask 3. The two mask marks 31c and 31d are aligned along the Y-axis on the positive side of the X-axis of the photomask 3.

As shown in FIGS. 1 and 8, four rectangular substrate marks 41a to 41d are formed on the non-photosensitive area 44 of the photosensitive substrate 4 as positioning marks for the photosensitive substrate 4. The four substrate marks 41a to 41d are arranged to be close to the four vertices of the shot area 43 in correspondence with the four mask marks 31a to 31d of the photomask 3. The two substrate marks 41a and 41b are aligned along the Y-axis on the negative side of the X-axis of the photosensitive substrate 4. The two substrate marks 41c and 41d are aligned along the Y-axis on the positive side of the X-axis of the photosensitive substrate 4.

As shown in FIGS. 1 and 3, the two alignment microscopes 5a and 5b each having an optical axis coinciding with corresponding one of the two projection optical systems 2a and 2b are fixed above the upper arm portion 92 of the carriage 9. The two alignment microscopes 5a and 5b pick up the images of the four mask marks 31a to 31d formed on the photomask 3 and the images of the four substrate marks 41a to 41d formed on the photosensitive substrate 4, thereby detecting the relative positional relationship between the photomask 3 and the photosensitive substrate 4.

When the carriage 9 is moved along the X-axis, and the two projection optical systems 2a and 2d are arranged above the two substrate marks 41a and 41b, or 41c and 41d, respectively, the two alignment microscopes 5a and 5b pick up the images of the four substrate marks 41a to 41d through the two projection optical systems 2a and 2d on the basis of a control signal input from the central control unit 10 (to be described later) and output the image pick up result to the central control unit 10 as a measurement signal.

More specifically, when the two projection optical systems 2a and 2d are arranged above the two substrate marks 41a and 41b, the alignment microscope 5a picks up the images of the mask mark 31a and the substrate mark 41a while the alignment microscope 5b picks up the images of the mask mark 31b and the substrate mark 41b. When the two projection optical systems 2a and 2d are arranged above the two substrate marks 41c and 41d, the alignment microscope 5a picks up the images of the mask mark 31c and the substrate mark 41c while the alignment microscope 5b picks up the images of the mask mark 31d and the substrate mark 41d.

As shown in FIG. 9, the central control unit 10 is constituted as a microcomputer included in the main body. In this central control unit 10, the control unit 11 outputs control signals for controlling the operations of the laser interferometer 100 and the two alignment microscopes 5a and 5b to these units, and thereafter, outputs control signals for controlling the operations of the carriage driving mechanism, the stage driving mechanism 70, the seven imaging characteristic adjustment mechanisms 8a to 8g, and the illumination optical system 6 to these units on the basis of a detection signal input from the deviation detection unit 12 and the correction value calculation unit 13 (to be described later).

The deviation detection unit 12 obtains a deviation of the photomask 3 with respect to an appropriate position on the basis of the detection result of the four mask marks 31a to 31d formed on the photomask 3. More specifically, the deviation detection unit 12 outputs a detection signal obtained by detecting a deviation amount of each of the four mask marks 31a to 31d corresponding to the four substrate marks 41a to 41d to the correction value calculation unit 13 on the basis of a measurement signal input from the two alignment microscopes 5a and 5b.

The correction value calculation unit 13 calculates various correction amounts on the basis of deviations associated with the four mask marks 31a to 31d, which are calculated by the deviation detection unit 12, and outputs the correction amounts to the stage driving mechanism 70 and the seven imaging characteristic adjustment mechanisms 8a to 8g through the control unit 11. When a plurality of mask marks are present, it is almost impossible to properly position all the mask marks in correspondence with the substrate marks. For this reason, the positional relationship between the photomask 3 and the photosensitive substrate 4 is set such that the average value of deviation amounts of the plurality of sets of mask marks and substrate marks is minimized.

More specifically, to set a positional relationship between the photomask 3 and the photosensitive substrate 4, which minimizes the average value of the deviation amounts of the four mask marks 31a to 31d with respecn to the four substrate marks 41a to 41d, the correction value calculation unit 13 calculates correction values for the position of the mask stage 7 along the X- and Y-axes and the rotation of the mask stage 7 about the Z-axis, correction values for the positions of the seven exposure areas 42a to 42g along the X- and Y-axes and the rotation of the exposure areas 42a to 42g about the Z-axis, and correction values for the imaging magnifications and orthogonalities of the exposure areas 42a to 42g with respect to the original pattern on the basis of detection signals input from the deviation detection unit 12 and measurement signals input from the laser interferometer 100 and outputs these detection signals to the control unit 11.

The deviation amounts of the four mask marks 31a to 31d corresponding to the four substrate marks 41a to 41d can be estimated to occur on the basis of the following four factors. First, a residual rotation error amount θ is generated because the rotation amount of the mask stage 7 about the Z-axis by the two driving motors 71a and 71b is not properly set. Second, an orthogonality error amount w is generated because the parallel movement along the Y-axis by the two driving motors 71a and 71b is not properly set to be perpendicular to the parallel movement along the X-axis by the driving motor 72.

Third, a linear expanding/contracting error amount ($R_x$, $R_y$) is a ratio of a measurement value to the design value of the distance between two points aligned on the photosensitive substrate 4 along the X- and Y-axes, which is generated because the photosensitive substrate 4 expands or contracts as a whole in correspondence with various processes. Fourth, an offset amount ($O_x$, $O_y$) is generated because the photomask 3 is displaced by very small amounts along the X- and Y-axes in correspondence with the alignment precision of the two alignment microscopes 5a and 5b.

A position ($F_{xn}$, $F_{yn}$) of each of the four mask marks 31a to 31d along the X- and Y-axes, which is to be theoretically set, is obtained by equation (1) on the basis of an ideal position ($D_{xn}$, $D_{yn}$) of each of the four mask marks 31a to 31d corresponding to the four substrate marks 41a to 41d along the X- and Y-axes:

$$\begin{bmatrix} F_{xn} \\ F_{yn} \end{bmatrix} = \begin{bmatrix} R_x, 0 \\ 0, R_y \end{bmatrix} \begin{bmatrix} \cos\theta, -\sin\theta \\ \sin\theta, \cos\theta \end{bmatrix} \begin{bmatrix} 1, -\tan w \\ 0, 1 \end{bmatrix} \begin{bmatrix} D_{xn} \\ D_{yn} \end{bmatrix} + \begin{bmatrix} O_x \\ O_y \end{bmatrix} \quad (1)$$

$$= \begin{bmatrix} R_x \cos\theta, -R_x(\cos\theta \tan w + \sin\theta) \\ R_y \sin\theta, R_y(-\sin\theta \tan w + \cos\theta) \end{bmatrix} \begin{bmatrix} D_{xn} \\ D_{yn} \end{bmatrix} + \begin{bmatrix} O_x \\ O_y \end{bmatrix}$$

where n is 1, 2, . . . , 4 and corresponds to the four mask marks 31a to 31d, respectively.

The residual rotation error amount θ and the orthogonality error amount w are very small. Therefore, equation (1) is expressed as equation (2) by applying primary approximation:

$$\begin{bmatrix} F_{xn} \\ F_{yn} \end{bmatrix} = \begin{bmatrix} R_x, -R_x(w+\theta) \\ R_y - \theta, R_y \end{bmatrix} \begin{bmatrix} D_{xn} \\ D_{yn} \end{bmatrix} + \begin{bmatrix} O_x \\ O_y \end{bmatrix} \quad (2)$$

A deviation amount ($\epsilon_{xn}$, $\epsilon_{yn}$) between the position ($F_{xn}$, $F_{yn}$) to be theoretically set and the ideal position ($D_{xn}$, $D_{yn}$) of each of the four mask marks 31a to 31d along the X- and Y-axes is obtained by equation (3):

$$\begin{bmatrix} \epsilon_{xn} \\ \epsilon_{yn} \end{bmatrix} = \begin{bmatrix} F_{xn} \\ F_{yn} \end{bmatrix} - \begin{bmatrix} D_{xn} \\ D_{yn} \end{bmatrix} \quad (3)$$

$$= \begin{bmatrix} R_x - 1, -R_x(w+\theta) \\ R_y - \theta, R_y - 1 \end{bmatrix} \begin{bmatrix} D_{xn} \\ D_{yn} \end{bmatrix} + \begin{bmatrix} O_x \\ O_y \end{bmatrix}$$

Equation (2) is expressed as equation (4) as a matrix calculation:

$$F_n = A \cdot D_n + O \quad (4)$$

for $$F_n = \begin{pmatrix} F_{xn} \\ F_{yn} \end{pmatrix} \quad (5)$$

$$A = \begin{pmatrix} a_{11}, a_{12} \\ a_{21}, a_{22} \end{pmatrix} = \begin{pmatrix} R_x, -R_x(w+\theta) \\ R_y - \theta, R_y \end{pmatrix} \quad (6)$$

When an actual position ($F'_{xn}$, $F'_{yn}$) of each of the $$D_n = \begin{pmatrix} D_{xn} \\ D_{yn} \end{pmatrix} \quad (7)$$

$$O = \begin{pmatrix} O_x \\ O_y \end{pmatrix} \quad (8)$$

four mask marks 31a to 31d is measured by the two alignment microscopes 5a and 5b, an address error E of a deviation amount ($E_{xn}$, $E_{yn}$) between the position ($F_{xn}$, $F_{yn}$) to be theoretically set and the actual position ($F'_{xn}$, $F'_{yn}$) of each of the four mask marks 31a to 31d along the X- and Y-axes can be obtained by equation (9) by applying a minimum square error as an estimating function:

$$E = \sum_{n=1}^{m} (E_{xn})^2 + \sum_{n=1}^{m} (E_{yn})^2 \quad (9)$$

$$= \sum_{n=1}^{m} (F_{xn} - F'_{xn})^2 + \sum_{n=1}^{m} (F_{yn} - F'_{yn})^2$$

where m is 4 and corresponds to the number of mask marks 31a to 31d.

To decrease the number of calculations, the offset amount ($O_x$, $O_y$) is obtained by two equations (10) and (11) as an average value of deviation amounts ($\Delta_{xn}$, $\Delta_{yn}$) along the X- and Y-axes between the actual positions ($F'_{xn}$, $F'_{yn}$) and the ideal positions ($D_{xn}$, $D_{yn}$) of the four mask marks 31a to 31d:

$$O_x = \frac{\sum_{n=1}^{m} (F'_{xn} - D_{xn})}{m} \quad (10)$$

$$O_y = \frac{\sum_{n=1}^{m} (F'_{yn} - D_{yn})}{m} \quad (11)$$

The deviation amount ($E_{xn}$, $E_{yn}$) between the position ($F_{xn}$, $F_{yn}$) to be theoretically set and the actual position ($F'_{xn}$, $F'_{yn}$) of each of the four mask marks 31a to 31d is obtained by two equations (12) and (13) on the basis of equation (4):

$$E_{xn} = F'_{xn} - F_{xn} \quad (12)$$

$$= F'_{xn} - a_{11} D_{xn} - a_{12} D_{yn} - O_x$$

$$E_{yn} = F'_{yn} - F_{yn} \quad (13)$$

$$= F'_{yn} - a_{21} D_{xn} - a_{22} D_{yn} - O_y$$

Four elements $a_{11}$ to $a_{22}$ of a parameter matrix A for minimizing the alignment error E are obtained by four equations (14) to (17) on the basis of the method of least squares, respectively:

$$a_{11} = \frac{\sum_{n=1}^{m} D_{xn} - D_{yn} \sum_{n=1}^{m} D_{yn} - (O_x - F_{xn}) - \sum_{n=1}^{m} D_{yn}^2 \sum_{n=1}^{m} D_{xn}(O_x - F_{xn})}{\sum_{n=1}^{m} D_{xn}^2 \sum_{n=1}^{m} D_{yn}^2 - \left(\sum_{n=1}^{m} D_{xn} - D_{yn}\right)^2} \quad (14)$$

$$a_{12} = \frac{\sum_{n=1}^{m} D_{xn} - D_{yn} \sum_{n=1}^{m} D_{xn} - (O_x - F_{xn}) - \sum_{n=1}^{m} D_{xn}^2 \sum_{n=1}^{m} D_{yn}(O_x - F_{xn})}{\sum_{n=1}^{m} D_{xn}^2 \sum_{n=1}^{m} D_{yn}^2 - \left(\sum_{n=1}^{m} D_{xn} - D_{yn}\right)^2} \quad (15)$$

$$a_{21} = \frac{\sum_{n=1}^{m} D_{xn} - D_{yn} \sum_{n=1}^{m} D_{yn} - (O_y - F_{yn}) - \sum_{n=1}^{m} D_{yn}^2 \sum_{n=1}^{m} D_{xn}(O_x - F_{yn})}{\sum_{n=1}^{m} D_{xn}^2 \sum_{n=1}^{m} D_{yn}^2 - \left(\sum_{n=1}^{m} D_{xn} - D_{yn}\right)^2} \quad (16)$$

$$a_{22} = \frac{\sum_{n=1}^{m} D_{xn} - D_{yn} \sum_{n=1}^{m} D_{xn} - (O_y - F_{yn}) - \sum_{n=1}^{m} D_{xn}^2 \sum_{n=1}^{m} D_{yn}(O_x - F_{yn})}{\sum_{n=1}^{m} D_{xn}^2 \sum_{n=1}^{m} D_{yn}^2 - \left(\sum_{n=1}^{m} D_{xn} - D_{yn}\right)^2} \quad (17)$$

The linear expanding/contracting error amount $(R_x, R_y)$, the residual rotation error amount $\theta$, and the orthogonality error amount $w$ are obtained by four equations (18) to (21) on the basis of equation (6), respectively:

$$R_x = a_{11} \quad (18)$$

$$R_y = a_{22} \quad (19)$$

$$\theta = a_{21}/R_y \quad (20)$$
$$= a_{21}/a_{22}$$

$$w = -a_{21}/R_y - a_{12}/R_x \quad (21)$$
$$= -a_{21}/a_{22} - a_{12}/a_{11}$$

The deviation detection unit 12 detects the deviation amount $(\Delta_{xn}, \Delta_{yn})$ between the ideal position and the actual position of each of the four mask marks 31a to 31d on the basis of measurement signals input from the two alignment microscopes 5a and 5b. At the same time, the deviation detection unit 12 detects the actual position $(F'_{xn}, F'_{yn})$ of each of the four mask marks 31a to 31d by defining the actual position of the corresponding one of the four substrate marks 41a to 41d as the ideal position $(D_{xn}, D_{yn})$ of each of the four mask marks 31a to 31d.

The correction value calculation unit 13 calculates the four elements $a_{11}$ to $a_{22}$ of the parameter matrix A for minimizing the alignment error E in accordance with the four equations (14) to (17) on the basis of detection signals output from the deviation detection unit 12, thereby calculating the deviation amount $(E_{xn}, E_{yn})$ between the position $(F_{xn}, F_{yn})$ to be theoretically set and the actual position $(F'_{xn}, F'_{yn})$ of each of the four mask marks 31a to 31d in accordance with the two equations (12) and (13).

As a result, the correction value calculation unit 13 calculates, on the basis of the measurement signals input from the laser interferometer 100, correction values for the position of the mask stage 7 along the X- and Y-axes and the rotation of the mask stage 7 about the Z-axis, and correction values for the positions of the seven exposure areas 42a to 42g along the X- and Y-axes, the rotations of the exposure areas 42a to 42g about the Z-axis, and the imaging magnifications and orthogonalities with respect to the original pattern.

Assume that the control unit 11 corrects the position of the mask stage 7 and the imaging characteristics of the seven projection optical systems 2a to 2g. In this case, for at least two of the four mask marks 31a to 31d, the correction value calculation unit 13 calculates the deviation amount $(\epsilon_{xn}, \epsilon_{yn})$ between the positions $(F_{xn}, F_{yn})$ to be theoretically set, which is calculated before correction, and the ideal position $(D_{xn}, D_{yn})$ in accordance with equation (3), and compares the deviation amount $(\epsilon_{xn}, \epsilon_{yn})$ with the deviation amount $(\Delta_{xn}, \Delta_{yn})$ between the actual position $(F'_{xn}, F'_{yn})$ which is calculated by the deviation detection unit 12 after correction and the ideal position $(D_{xn}, D_{yn})$.

The control unit 11 outputs a control signal for correcting the parallel moving amounts of the mask stage 7 along the X- and Y-axes and the rotation amount of the mask stage 7 about the Z-axis to the stage driving mechanism 70. At the same time, the control unit 11 outputs control signals for correcting the parallel moving amounts of the seven exposure areas 42a to 42g along the X- and Y-axes, the rotation amounts of the exposure areas 42a to 42g about the Z-axis, and the imaging magnifications and orthogonalities with respect to the original pattern to the seven imaging characteristic adjustment mechanisms 8a to 8g.

After the position of the mask stage 7 and the imaging characteristics of the seven projection optical systems 2a to 2g are corrected, the control unit 11 outputs a control signal for operating the two alignment microscopes 5a and 5b to measure the deviation amounts $(\Delta_{xn}, \Delta_{yn})$ between the ideal positions $(D_{xn}, D_{yn})$ and the actual positions $(F'_{xn}, F'_{yn})$ for at least two of the four mask marks 31a to 31d.

When it is detected, on the basis of the detection signal input from the correction value calculation unit 13, that the difference between the two deviation amounts $(\epsilon_{xn}, \epsilon_{yn})$ and $(\Delta_{xn}, \Delta_{yn})$ associated with at least two of the four mask marks 31a to 31d falls within a predetermined allowance, the control unit 11 outputs a control signal to the illumination optical system 6 to designate irradiation of an exposure light beam, and also outputs a control signal to the carriage driving mechanism to designate movement of the carriage 9 with respect to the seven projection optical systems 2a to 2g. Otherwise, positioning of the photomask 3 and the photosensitive substrate 4 is repeatedly performed.

Figure 10:
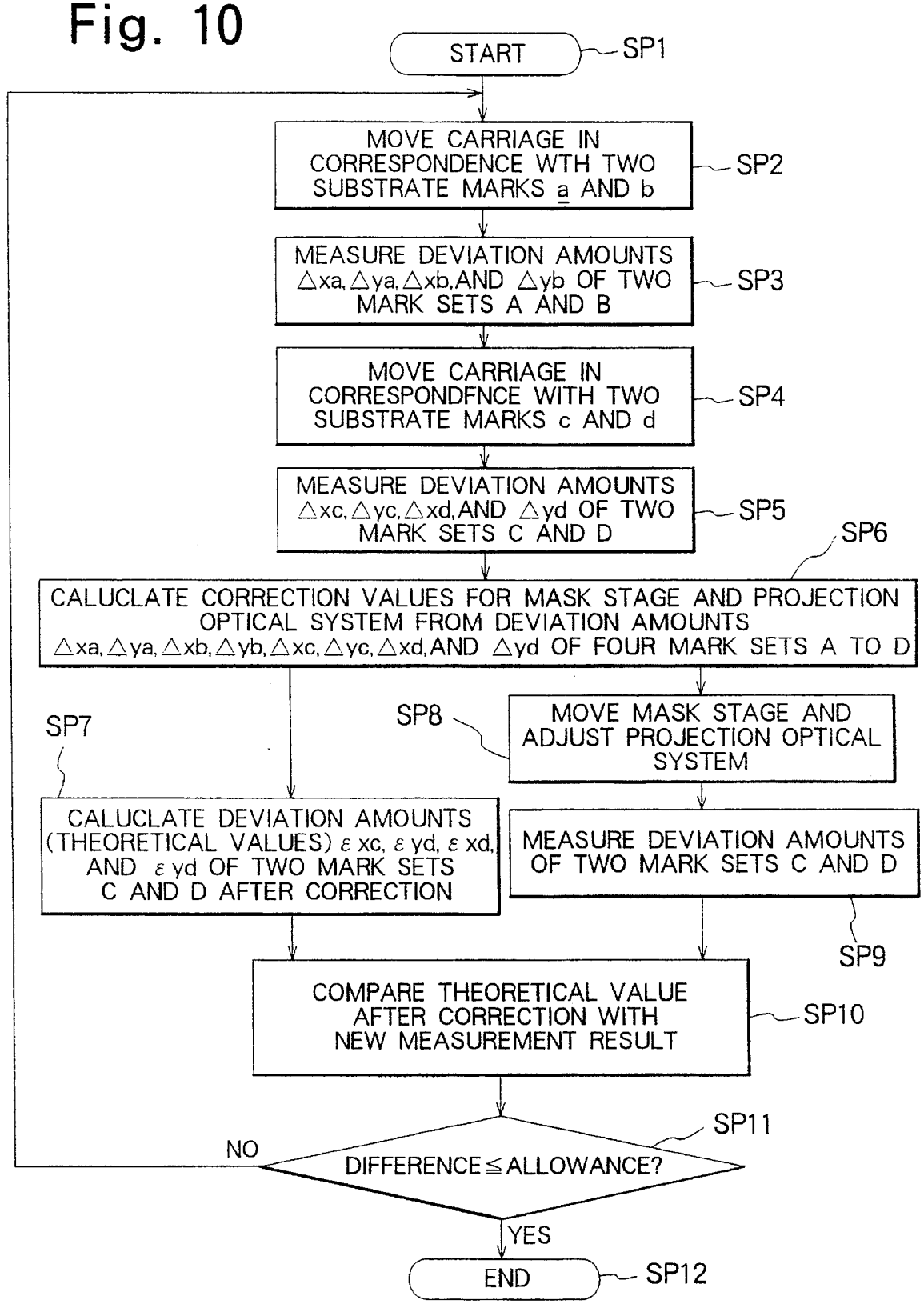
FIG. 10 is a flow chart showing an alignment process in an exposure method applied to the exposure apparatus shown in FIG. 1.

An exposure method including the step of positioning the photomask 3 and the photosensitive substrate 4 in the scanning exposure apparatus 1 having a plurality of projection optical systems of a multilens type will be described below in detail. Referring to FIG. 10, the four substrate marks 41a to 41d are simply referred to as four substrate marks a to d. Additionally, a combination of the substrate mark 41a and the mask mark 31a is referred to as a mark set A. Combinations of the substrate marks 41b to 41d and the mask marks 31b to 31d are similarly referred to as mark sets B to D.

In this embodiment, after an adjusting operation of positioning of the photomask 3 and the photosensitive substrate 4 is completed, the relative positional relationship between the photomask 3 and the photosensitive substrate 4 is detected again. Until the correction value calculated on the basis of the detection result falls within a predetermined allowance, the adjusting operation of positioning is repeated. when measurement is to be newly performed after the relative positional relationship between the photomask 3 and the photosensitive substrate 4 is corrected, a new correction value is calculated on the basis of a result obtained upon observation of only two of the four mask marks 31a to 31d, thereby shorting the process time.

Even when the adjusting operation of positioning of the photomask 3 and the photosensitive substrate 4 is completed, the scanning exposure operation is not immediately started. For this reason, a relative displacement or a degradation in imaging characteristics, which is generated by an error caused due to movement of the mask stage 7 by the three driving motors 71a, 71b, and 72, or an error caused due to correction of the optical characteristics of the seven projection optical systems 2a to 2g, can be removed.

As shown in FIG. 10, in step SP1, the photomask 3 and the photosensitive substrate 4 are roughly positioned by a prealignment apparatus (not shown), and thereafter, the photosensitive substrate 4 is chucked and held on the upper surface of the lower arm portion 93 of the carriage 9 while the photomask 3 is chucked and held on the surface of the mask stage 7 arranged on the upper arm portion 92 of the carriage 9. The flow advances to step SP2.

Figure 11A:
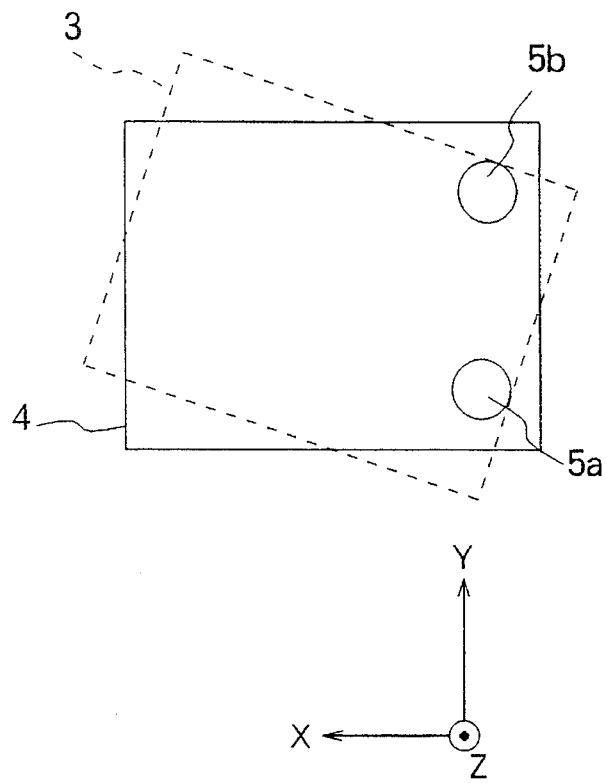
FIGS. 11A to 11C are plan views showing a deviation amount in the positional relationship subjected to measurement on one end side of each of the photomask and the photosensitive substrate before position correction.

In step SP2, as shown in FIG. 11A, the carriage 9 is moved along the X-axis by the carriage driving mechanism to arrange the two projection optical systems 2a and 2d above the two substrate marks 41a and 41b, respectively. The flow advances to step SP3.

Figure 11B:
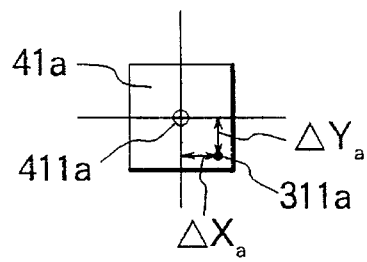
Figure 11C:
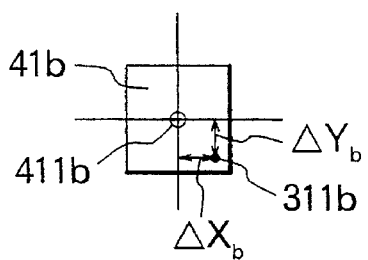

In step SP3, as shown in FIG. 11B, the images of the substrate mark 41a and the mask mark 31a are picked up by the alignment microscope 5a. A deviation amount $(\Delta_{xa},\Delta_{ya})$ between the position of a central point 411a of the substrate mark 41a and that of a central point 311a of the mask mark 31a is detected by the deviation detection unit 12 of the central control unit 10. In addition, the actual position of the predetermined central point 411a is set as an ideal position $(D_{xa},D_{ya})$ of the central point 311a, thereby detecting an actual position $(F'_{xa},F'_{ya})$ of the central point 311a As shown in FIG. 11C, the images of the substrate mark 41b and the mask mark 31b are picked up by the alignment microscope 5b. A deviation amount $(\Delta_{xb}, \Delta_{yb})$ between the position of a central point 411b of the substrate mark 41b and that of a central point 311b of the mask mark 31b is detected by the deviation detection unit 12 of the central control unit 10. In addition, the actual position of the predetermined central point 411b is set as an ideal position $(D_{xb},\Delta_{yb})$ of the central point 311b, thereby detecting an actual position $(F'_{xb},F'_{yb})$ of the central point 311b. The flow advances to step SP4.

Figure 12A:
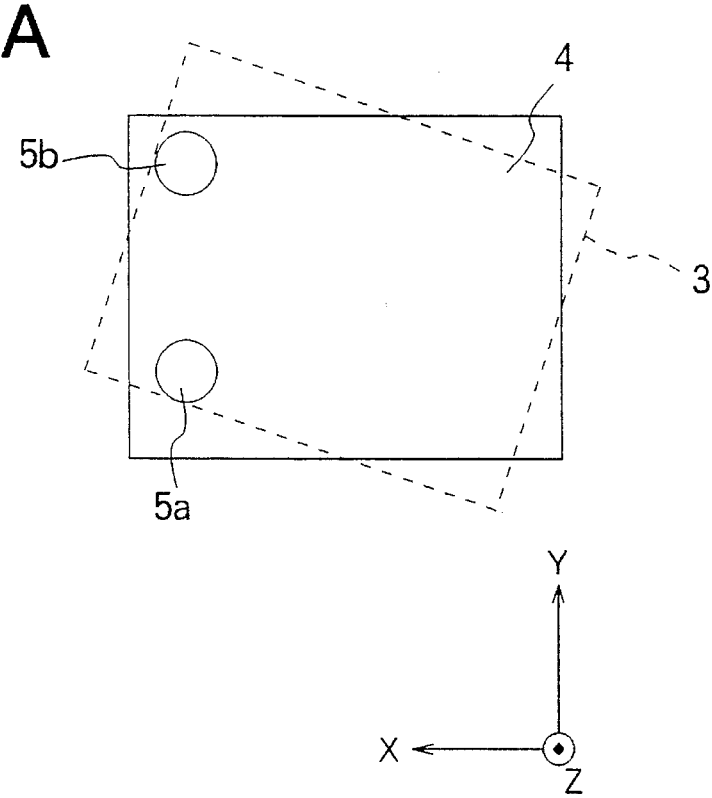
FIGS. 12A to 12C are plan views showing a deviation amount in the positional relationship subjected to measurement on the other end side of each of the photomask and the photosensitive substrate before position correction.

In step SP4, as shown in FIG. 12A, the carriage 9 is moved along the X-axis by the carriage driving mechanism while holding the relative positional relationship between the photomask 3 and the photosensitive substrate 4, which is determined in step SP2. With this process, the two projection optical systems 2a and 2d are arranged above the two substrate marks 41c and 41d, respectively. The flow advances to step SP5.

Figure 12B:
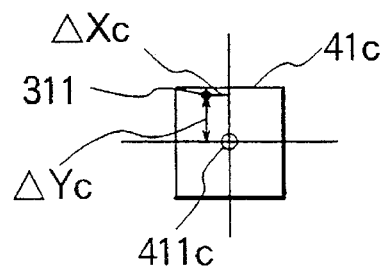

In step SP5, as shown in FIG. 12B, the images of the substrate mark 41c and the mask mark 31c are picked up by the alignment microscope 5a. A deviation amount $(\Delta_{xc},\Delta_{yc})$ between the position cf a central point 411c of the substrate mark 41c and that of a central point 311c of the mask mark 31c is detected by the deviation detection unit 12 of the central control unit 10. In addition, the actual position of the predetermined central point 411c is set as an ideal position $(D_{xc},D_{yc})$ of the central point 311c, thereby detecting an actual position $(F'_{xc},F'_{yc})$ of the central point 311c.

Figure 12C:
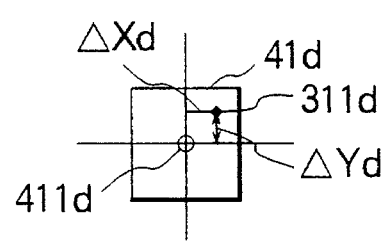

As shown in FIG. 12C, the images of the substrate mark 41d and the mask mark 31d are picked up by the alignment microscope 5b. A deviation amount $(\Delta_{xd},\Delta_{yd})$ between the position of a central point 411d of the substrate mark 41d and that of a central point 311d of the mask mark 31d is detected by the deviation detection unit 12 of the central control unit 10. In addition, the actual position of the predetermined central point 411d is set as an ideal position $(D_{xd},D_{yd})$ of the central point 311d, thereby detecting an actual position $(F'_{xd},F'_{yd})$ of the central point 311d. The flow advances to step SP6.

In step SP6, the deviation amount $(E_{xn},E_{yn})$ between the position $(F_{xn},F_{yn})$ to be theoretically set and the actual position $(F'_{xn},F'_{yn})$ of each of the four mask marks 31a to 31d is calculated by the correction value calculation unit 13 of the central control unit 10. With this process, to position the photomask 3 and the photosensitive substrate 4, correction values for the position of the mask stage 7 along the X- and Y-axes and the rotation of the mask stage 7 about the Z-axis are calculated. At the same time, correction values for the positions of the seven exposure areas 42a to 42g along the X- and Y-axes, the rotations of the exposure areas 42a to 42g about the Z-axis, and the imaging magnifications and orthogonalities with respect to the original pattern are calculated. Thereafter, the flow advances to steps SP7 and SP8.

In step SP7, the deviation amount $(\epsilon_{xn},\epsilon_{yn})$ between the position $(F_{xn},F_{yn})$ to be theoretically set, which is calculated in step SP6, and the ideal position $(D_{xn},D_{yn})$ of each of the two mask marks 31c and 31d is calculated by the correction value calculation unit 13 of the central control unit 10. After the process in step SP9 is completed, the flow advances to step SP10.

In step SP8, the parallel moving or translating amounts of the mask stage 7 along the X- and Y-axes and the rotation amount of the mask stage 7 about the Z-axis are corrected by the stage driving mechanism 70. In addition, the parallel moving amounts of the seven exposure areas 42a to 42g along the X- and Y-axes, the rotation amounts of the exposure areas 42a to 42g about the Z-axis, and the imaging magnifications and orthogonalities with respect to the original pattern are corrected by the seven imaging characteristic adjustment mechanisms 8a to 8g. The flow advances to step SP9.

Figure 13A:
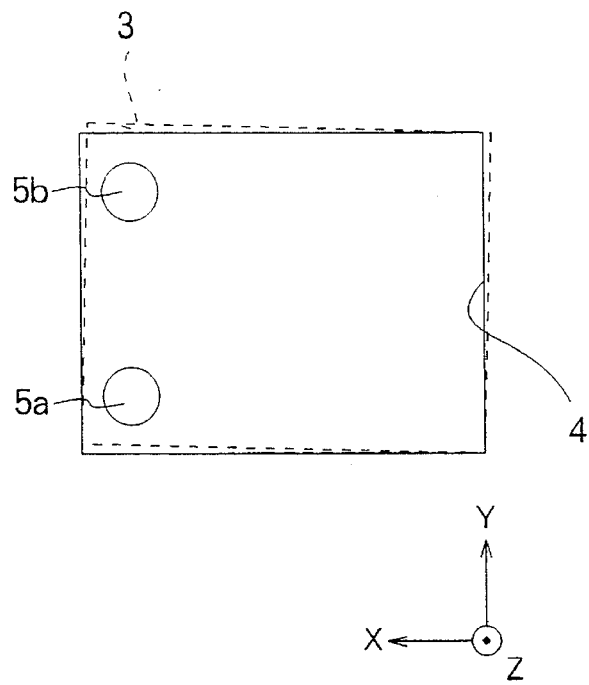
FIGS. 13A to 13C are plan views showing a deviation amount in the positional relationship subjected to measurement again on the other end side of each of the photomask and the photosensitive substrate after position correction.
Figure 13B:
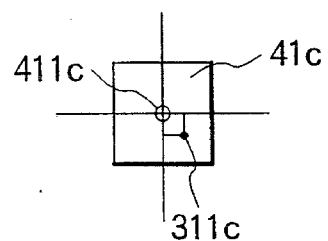

In step SP9, as shown in FIG. 13A, the carriage 9 is not moved by the carriage driving mechanism after step SP4, and a state wherein the two projection optical systems 2a and 2d are arranged above the two substrate marks 41c and 41d, respectively, is maintained. As shown in FIG. 13B, the images of the substrate mark 41c and the mask mark 31c are picked up by the alignment microscope 5a. The deviation amount $(\Delta_{xc},\Delta_{yc})$ between the position of the central point 411c of the substrate mark 41c and that of the central point 311c of the mask mark 31c is detected again by the deviation detection unit 12 of the central control unit 10.

Figure 13C:
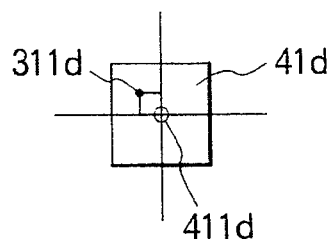

As shown in FIG. 13C, the images of the substrate mark 41d and the mask mark 31d are picked up by the alignment microscope 5b. The deviation amount between the position of the central point 411d of the substrate mark 41d and that of the central point 311d of the mask mark 31d is detected again by the deviation detection unit 12 of the central control unit 10. The flow advances to step SP10.

In step SP10, for each of the two mask marks 31c and 31d, the correction value calculation unit 13 calculates the difference between the deviation amount $(\epsilon_{xn},\epsilon_{yn})$ calculated in step SP7 and the deviation amount $(\Delta_{xn},\Delta_{yn})$ calculated in step SP9. The flow advances to step SP11.

In step SP11, the difference between the two deviation amounts $(\epsilon_{xn},\epsilon_{yn})$ and $(\Delta_{xn},\Delta_{yn})$ associated with the each of two mask marks 31c and 31d, which is calculated in step S10, is compared with a predetermined allowance. When the difference falls outside the allowance (when a negative result is obtained), the flow returns to step SP2 to repeat the processes of steps SP2 to SP11, i.e., to repeat positioning of the photomask 3 and the photosensitive substrate 4. Otherwise (when a positive result is obtained), the flow advances to step SP12 to complete positioning of the photomask 3 and the photosensitive substrate 4.

In step SP12, the illumination optical system 6 irradiates an exposure light beam on the photomask 3, thereby irradiating the exposure light beam on the upper surface of the photosensitive substrate 4 through the seven projection optical systems 2a to 2g. At the same time, the carriage 9 is moved along the X-axis with respect to the seven projection optical systems 2a to 2g by the carriage driving mechanism. More specifically, the image of the original pattern formed on the photomask 3 is sequentially exposed on the upper surface of the photosensitive substrate 4, thereby performing a scanning exposure operation.

As described above, after the position of the mask stage 7 is corrected, or the imaging characteristics of the seven projection optical systems 2a to 2g are corrected on the basis of the correction values calculated by the central control unit 10, it is detected again before the start of the exposure operation whether the difference between the measurement value and the expected value associated with the positional relationship between the photomask 3 and the photosensitive substrate 4 is within the allowance. When the difference between the measurement value and the expected value associated with the positional relationship between the photomask 3 and the photosensitive substrate 4 falls outside the allowance, positioning processing is repeated. Therefore, a scanning exposure method and apparatus having a positioning function more accurate than that of the prior art can be realized.

The present invention is not limited to the above embodiment, and various changes and modifications can also be made.

In the above embodiment, four mask marks are formed on the photomask, and four substrate marks are formed on the photosensitive substrate. However, the number of mask marks or substrate marks is not necessarily limited to four as far as a plurality of marks are formed.

In the above embodiment, when measurement is to be performed again after the relative positional relationship between the photomask and the photosensitive substrate is corrected, new correction values are calculated on the basis of a result of observation of only two of the four mask marks. However, the number of mask marks to be measured again is not necessarily limited to two as far as a plurality of mask marks are measured.

In the above embodiment, the relative positional relationship between the photomask and the photosensitive substrate is corrected by controlling driving of the mask stage having the photomask mounted thereon. However, the photosensitive substrate may be mounted on a substrate stage, and the substrate stage may be controlled, or both driving of the mask stage and driving of the substrate stage may be controlled.

In the above embodiment, both the position of the mask stage and the imaging characteristics of the projection optical system are adjusted to correct the relative positional relationship between the photomask and the photosensitive substrate. However, only the position of the mask stage may be adjusted, or only the imaging characteristics of the projection optical system may be adjusted.

In the above embodiment, when the positional relationship between the photomask and the photosensitive substrate is to be measured, the substrate marks are observed through the projection optical systems. However, the substrate marks may also be observed without interposing the projection optical systems.

In the above embodiment, the irradiation area of the illumination optical system scans the original pattern of the photomask while the exposure area of the projection optical system scans the upper surface of the photosensitive substrate, thereby executing a scanning exposure function. However, the illumination area of the illumination optical system may simultaneously illuminate the entire original pattern of the photomask, and the exposure area of the projection optical system may expose the entire image of the original pattern onto the upper surface of the photosensitive substrate by one shot to realize a stepping exposure function.

In the above embodiment, a rectangular illumination area is formed on the surface of the photomask by the illumination optical system. However, the shape of the illumination area is not limited to a rectangular shape. It is preferably made as similar as possible to the shape of the field area formed by the projection optical system by changing the shape of the opening portion of the field stop.

In the above embodiment, the projection optical system is constituted by two partial optical systems as a modification of a Dyson optical system. However, the two partial optical systems may be constituted by the Dyson optical system itself. In addition, the projection optical system may be constituted by a single Oftener optical system.

In the above embodiment, the field stop in the projection optical system has a trapezoidal opening portion. However, the shape of the opening portion of the field stop is not limited to a trapezoidal shade. It preferably corresponds to the arrangement of the projection optical system of a multilens type and has a shape for obtaining a uniform exposure light amount distribution on the entire upper surface of the photosensitive substrate.

As has been described above in detail, in the exposure method and apparatus according to the present invention, after the position of the mask stage is corrected, or the imaging characteristics of the projection optical system is corrected, the relative positional relationship between the photomask and the photosensitive substrate is measured before the start of an exposure operation. Measurement of the relative positional relationship between the photomask and the photosensitive substrate, and relative movement of the photomask and the photosensitive substrate on the basis of the correction values obtained by the measurement are repeatedly executed until the deviation between the measurement value and the expected value falls within a predetermined allowance.

Therefore, an exposure method and apparatus which can minimize displacement of the original pattern of the photomask with respect to the shot area of the photosensitive substrate and perform exposure processing on the basis of positioning more accurate than that of the prior art can be provided.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No.289153/1994 filed on Oct. 28 1994 is hereby incorporated by reference.

What is claimed is:

1. An exposure method comprising:
   the first step of measuring a positional relationship between a first mask mark formed on a photomask which has a pattern and a first substrate mark formed on a photosensitive substrate in correspondence with said first mask mark;

the second step of measuring a positional relationship between a second mask mark formed on said photomask at a position different from that of said first mask mark and a second substrate mark formed on said photosensitive substrate in correspondence with said second mask mark;

the third step of adjusting relative positions of said photomask and said photosensitive substrate on the basis of the results measured in said first and second steps, and estimating a positional deviation amount between said photomask and said photosensitive substrate in thus adjusted state;

the fourth step of executing at least one of said first and second steps again to detect the first or second positional deviation amount between said photomask and said photosensitive substrate; and the fifth step of judging whether said pattern should be exposed on said photosensitive substrate or not, on the basis of the positional deviation amounts between said photomask and said photosensitive substrate estimated in said third step and detected in said fourth step.

2. A method according to claim 1, wherein said third step includes a step of adjusting imaging characteristics of a projection optical system for projecting an image of said pattern onto said photosensitive substrate, in order to adjust the relative positions of said photomask and said photosensitive substrate.

3. A method according to claim 1, wherein a plurality of said first mask marks are formed on said photomask at not less than two positions and a plurality of said first substrate marks are formed on said photosensitive substrate at not less than two positions.

4. A method according to claim 1, wherein a plurality of said second mask marks are formed on said photomask at not less than two positions and a plurality of said second substrate marks are formed on said photosensitive substrate at not less than two positions.

5. A method according to claim 1, further comprising a step of synchronistically moving said photomask and said photosensitive substrate between said first and second steps.

6. A method according to claim 1, wherein a positional deviation amount between said second mask marks and said second substrate mark is estimated as the positional deviation amount between said photomask and said photosensitive substrate in said third step.

7. A method according to claim 1, wherein a first positional deviation amount between said first mask mark and said first substrate mark and a second positional deviation amount between said second mask mark and said second substrate mark are calculated as the positional deviation amount between said photomask and said photosensitive substrate in the adjusted state in said third step so that an average value of the first and second positional deviation amounts are minimized.

8. An exposure method comprising:

the first step of measuring a positional relationship between a first mask mark formed on a photomask which has a pattern and a first substrate mark formed on a photosensitive substrate in correspondence with said first mask mark;

the second step of measuring a positional relationship between a second mask mark formed on said photomask at a position different from that of said first mask mark and a second substrate mark formed on said photosensitive substrate in correspondence with said second mask mark;

the third step of adjusting relative positions of said photomask and said photosensitive substrate on the basis of the results measured in said first and second steps, and estimating a positional deviation amount between said photomask and said photosensitive substrate in thus adjusted state;

the fourth step of executing either said first step or said second step again to detect the first or second positional deviation amount between said photomask and said photosensitive substrate; and a fifth step of judging whether said pattern should be exposed on said photosensitive substrate or not, on the basis of the positional deviation amounts between said photomask and said photosensitive substrate estimated in said third step and detected in said fourth step.

9. A method according to claim 8, further comprising a step of synchronistically moving said photomask and said photosensitive substrate between said first and second steps.

10. A method according to claim 8, wherein a positional deviation amount between said second mask marks and said second substrate mark is estimated as the positional deviation amount between said photomask and said photosensitive substrate in said third step.

11. A method according to claim 8, wherein said second stop is again executed in said fourth step.

12. A method according to claim 8, wherein one of said first and second steps is again executed in said fourth step, in correspondence with either said first mask mark or said second mask mark located in the neighborhood of a measurement system for performing both the measurements in said first and second steps.

13. A method according to claim 8, wherein a first positional deviation amount between said first mask mark and said first substrate mark and a second positional deviation amount between said second mask mark and said second substrate mark are calculated as the positional deviation amount between said photomask and said photosensitive substrate in the adjusted state in said third step so that an average value of the first and second positional deviation amounts are minimized.

14. An exposure apparatus for exposing a pattern of a photomask on a photosensitive substrate, comprising:

a first measurement system which measures relative positional relationships between a plurality of mask marks formed on said photomask and a plurality of substrate marks formed on said photosensitive substrate in correspondence with said plurality of mask marks;

an adjustment mechanism which is connected to said first measurement system and adjusts relative positions of said photomask and said photosensitive substrate on the basis of the result measured by said first measurement system; and a second measurement system which measures the positional relationships between said plurality of mask marks and said plurality of substrate marks wherein the number of said mask marks and substrate marks measured in said second measurement system is less than that measured by said first measurement system.

15. An apparatus according to claim 14, further comprising an estimation unit which estimates a positional deviation amount between said photomask and said photosensitive substrate in the state adjusted by said adjustment mechanism, and a judgement unit which judges whether said pattern should be exposed on said photosensitive substrate or not, on the basis of the results measured by said second measurement system and estimated by said estimation unit.

16. An apparatus according to claim 15, wherein said estimation unit calculates a plurality of positional deviation amounts between said plurality of mask marks and said plurality of substrate marks as the positional deviation amount between said photomask and said photosensitive substrate in the state adjusted by said adjustment mechanism, so as to minimize an average value of the plurality of positional deviation amounts.

17. An apparatus according to claim 14, further comprising a holding member which holds said photomask and said photosensitive substrate, and wherein said first measurement system performs the measurement accompanied with the movement of said holding member and said second measurement system performs the measurement without the movement of said holding member.

18. An apparatus according to claim 14, further comprising a plurality of projection optical systems which project an image of said pattern onto said photosensitive substrate, and wherein said first and second measurement systems perform the measurements through two projection optical systems arranged at both ends of said plurality of projection optical systems.

19. An exposure apparatus for exposing a pattern of a photomask on a photosensitive substrate, comprising:

- a plurality of projection optical systems which project an image of said pattern onto said photosensitive substrate;
- a mobile mechanism which holds said photomask and said photosensitive substrate and relatively moves with respect to said plurality of projection optical systems;
- a stage mechanism which relatively moves said photomask and said photosensitive substrate;
- an imaging characteristic adjustment mechanism which is arranged between said photomask and said substrate and adjusts imaging characteristic of at least one projection optical system of said plurality of projection optical systems;
- a first measurement system which measures positional relationships between a plurality of mask marks formed on said photomask and a plurality of substrate marks formed on said photosensitive substrate in correspondence with said plurality of mask marks;
- a control unit which controls operations of said stage mechanism and said imaging characteristic adjustment mechanism on the basis of the result measured by said first measurement system; and
- a second measurement system which measures the positional relationships between said plurality of mask marks and said plurality of substrate marks in correspondence with a control by said control unit.

20. An apparatus according to claim 19, wherein said first measurement system performs the measurement accompanied with the movement of said mobile mechanism.

21. An apparatus according to claim 19, wherein a number of the positional relationships measured by said second measurement system is less than that measured by said first measurement system.

22. An apparatus according to claim 19, further comprising an estimation unit which estimates a positional deviation amount between said photomask and said photosensitive substrate in a state controlled by said control unit, and a judgement unit which judges whether said pattern should be exposed on said photosensitive substrate or not, on the basis of the results measured by said second measurement system and estimated by said estimation unit.

23. An apparatus according to claim 22, wherein said estimation unit calculates a plurality of positional deviation amounts between said plurality of mask marks and said plurality of substrate marks as the positional deviation amount between said photomask and said photosensitive substrate in the state controlled by said control unit, so as to minimize an average value of the plurality of positional deviation amounts.

* * * * *